United States Patent
Tanaka et al.

(10) Patent No.: US 7,557,991 B2
(45) Date of Patent: Jul. 7, 2009

(54) LASER IRRADIATION APPARATUS, LASER IRRADIATION METHOD, AND METHOD FOR MANUFACTURING SEMICONDUCTOR DEVICE

(75) Inventors: Koichiro Tanaka, Kanagawa (JP); Hirotada Ohishi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 346 days.

(21) Appl. No.: 11/292,303

(22) Filed: Dec. 2, 2005

(65) Prior Publication Data

US 2006/0119949 A1    Jun. 8, 2006

(30) Foreign Application Priority Data

Dec. 6, 2004  (JP)  ............................. 2004-353435

(51) Int. Cl.
*G02B 27/10*  (2006.01)
(52) U.S. Cl. ...................................... 359/623; 359/619
(58) Field of Classification Search .................. 359/623
See application file for complete search history.

(56) References Cited

U.S. PATENT DOCUMENTS

| | | | |
|---|---|---|---|
| 5,822,125 A | 10/1998 | Meyers | |
| 5,854,803 A | 12/1998 | Yamazaki et al. | |
| 6,300,176 B1 | 10/2001 | Zhang et al. | |
| 6,689,651 B2 | 2/2004 | Zhang et al. | |
| 6,750,424 B2 | 6/2004 | Tanaka | |
| 2003/0058916 A1* | 3/2003 | Tanaka et al. | ................ 372/101 |
| 2004/0155019 A1 | 8/2004 | Tanaka | |
| 2005/0111105 A1 | 5/2005 | Tanaka | |
| 2005/0213218 A1* | 9/2005 | Tanaka et al. | ................ 359/619 |

FOREIGN PATENT DOCUMENTS

| | | |
|---|---|---|
| JP | 08-088196 | 4/1996 |
| JP | 08-195357 | 7/1996 |

OTHER PUBLICATIONS

European Search Report dated Feb. 7, 2006 for Application No. 05026275.7.

* cited by examiner

*Primary Examiner*—Jordan M. Schwartz
*Assistant Examiner*—James C Jones
(74) *Attorney, Agent, or Firm*—Eric J. Robinson; Robinson Intellectual Property Law Office, P.C.

(57) ABSTRACT

It is an object of the present invention to provide a laser irradiation apparatus which can form a linear beam spot with a short optical path length, form a linear beam spot being long in a long-side direction, and reduce displacement of a condensing point at opposite ends in a direction of its line. In a laser irradiation apparatus having an optical system for shaping a laser beam emitted from a laser oscillator into a linear beam spot having a long-side direction and a short-side direction, the optical system includes a long-side direction condensing cylindrical lens disposed between a first short-side direction condensing cylindrical lens and a second short-side direction condensing cylindrical lens. Displacement of a position of a homogeneous plane is generated by the long-side direction condensing cylindrical lens so that a distance from the homogeneous plane to the second short-side direction condensing cylindrical lens is constant not depending on a field angle.

9 Claims, 14 Drawing Sheets

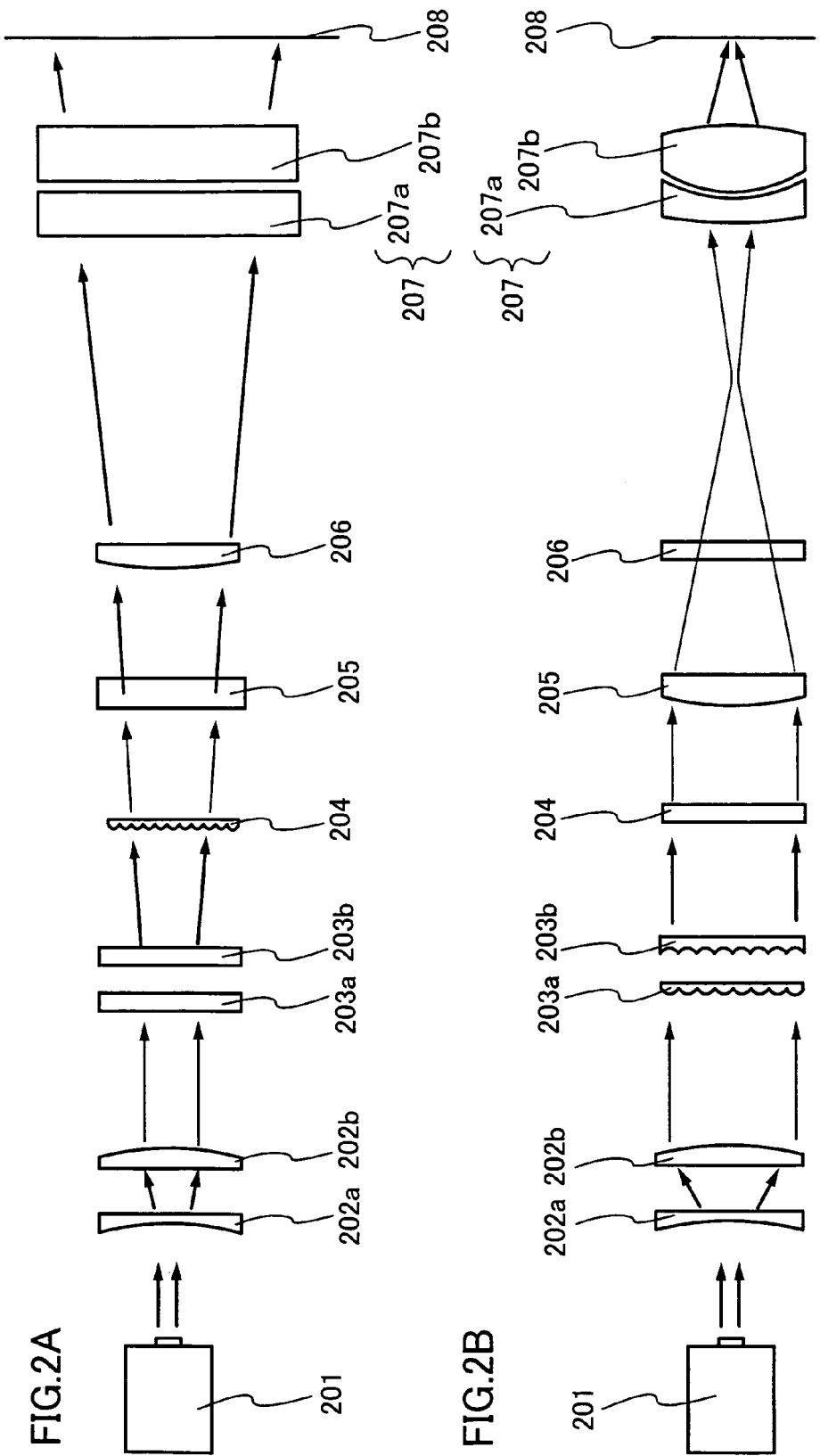

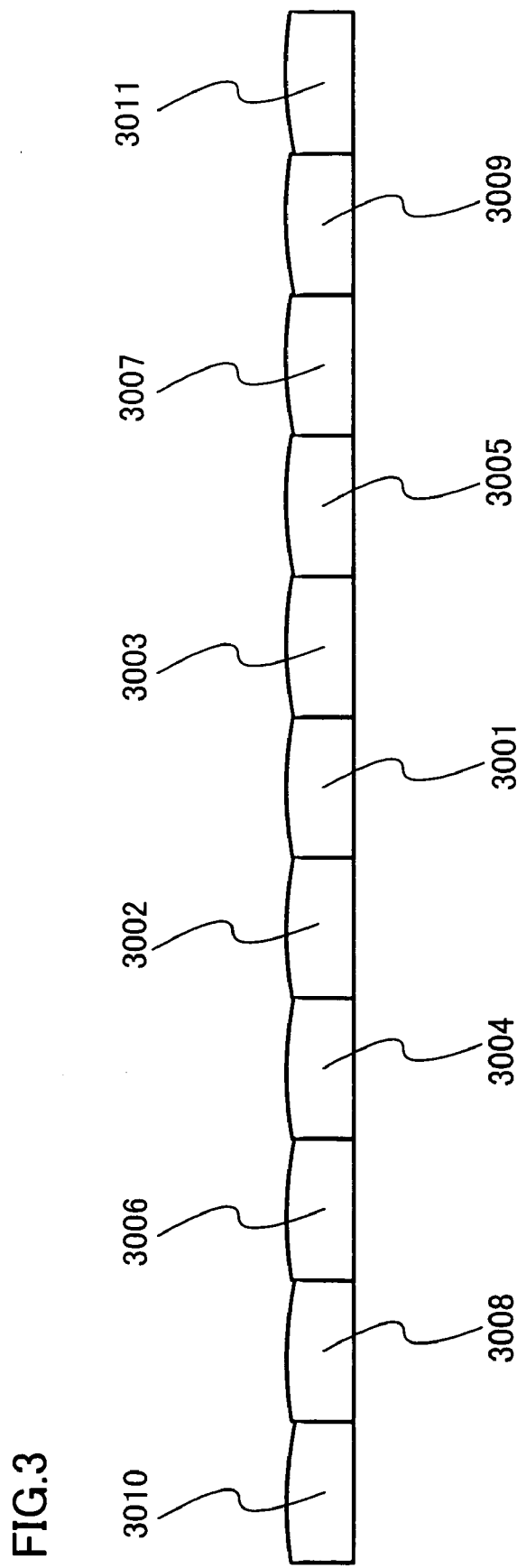

terminal portion | pixel portion

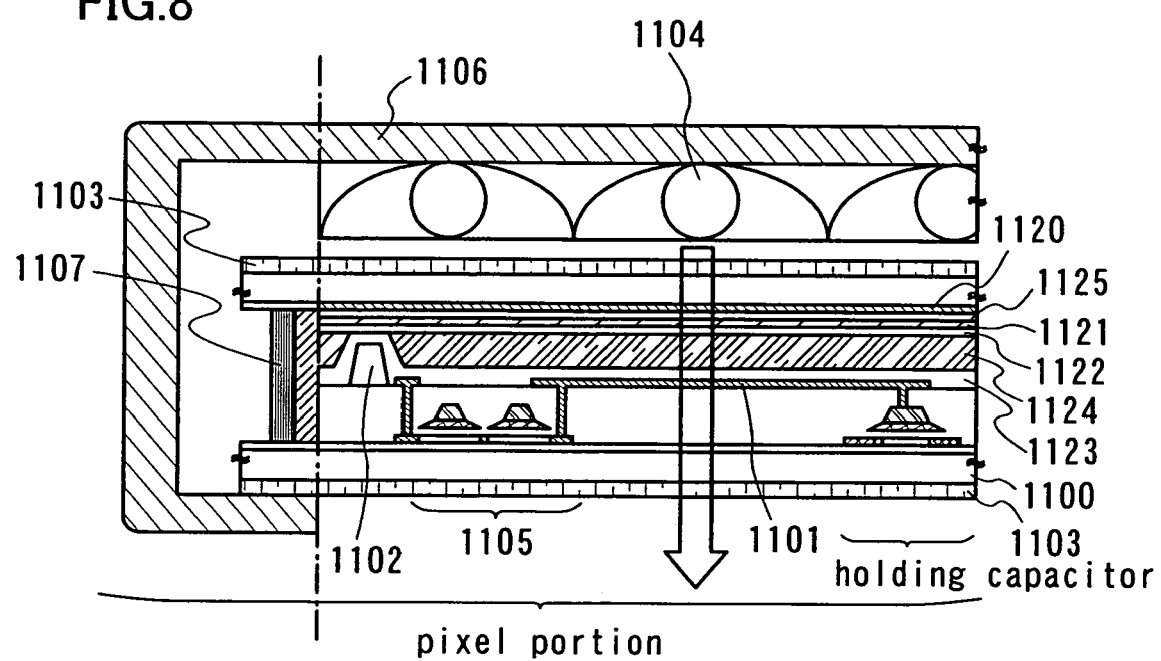

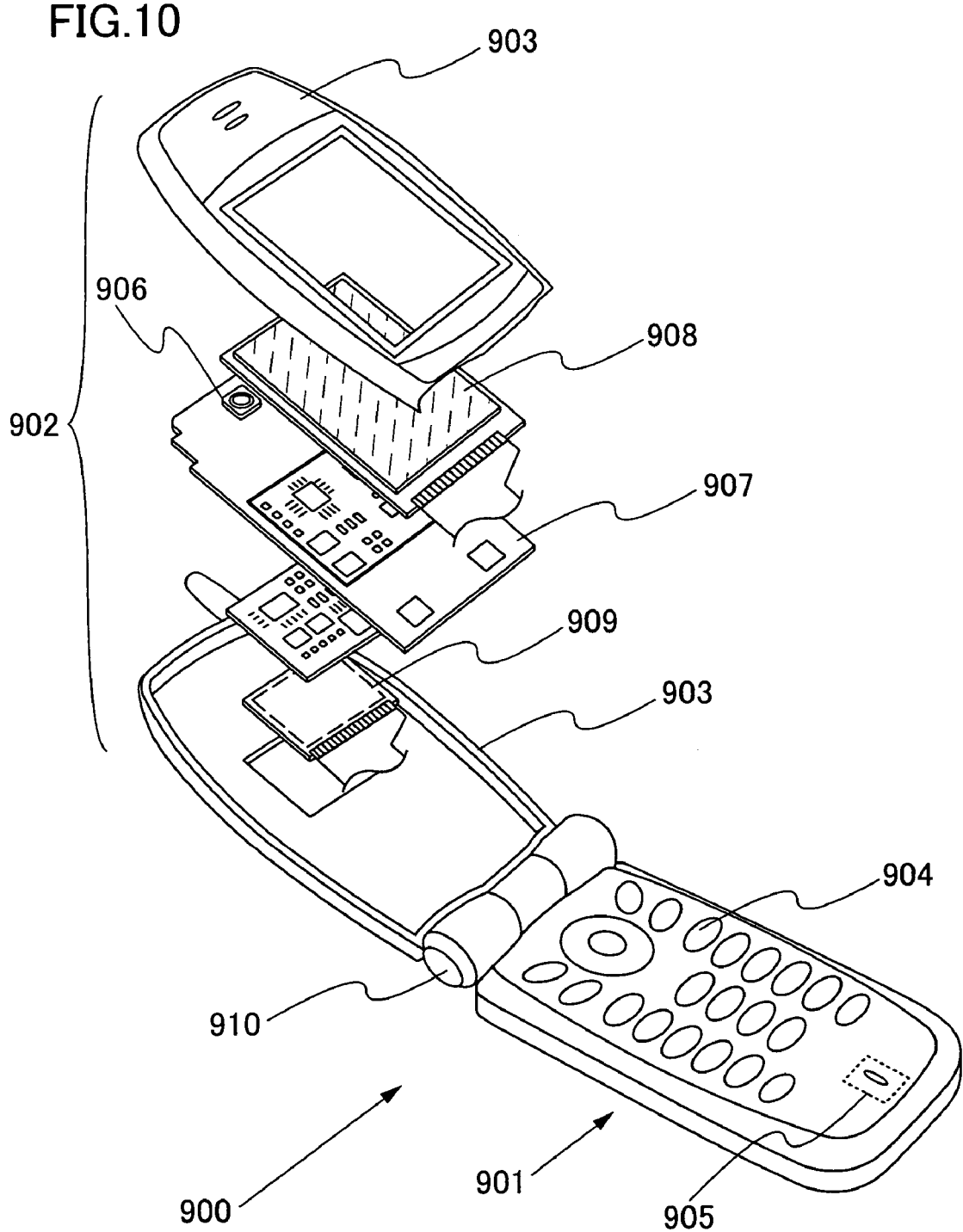

LASER IRRADIATION APPARATUS, LASER IRRADIATION METHOD, AND METHOD FOR MANUFACTURING SEMICONDUCTOR DEVICE

BACKGROUND OF THE INVENTION

1. Field of the Invention

The present invention relates to a laser irradiation apparatus and a laser process method which are for irradiating a semiconductor film or the like with a laser beam for crystallization, recrystallization, or activation after ion implantation. Moreover, the present invention relates to a laser irradiation apparatus and a laser process method which are for irradiating a poly-crystalline or near-poly-crystalline semiconductor film with a laser beam to improve the crystallinity of the semiconductor film. The above processes are hereinafter referred to as laser annealing. The present invention further relates to a method for manufacturing a semiconductor device by conducting the above laser process. It is to be noted that the semiconductor device herein described indicates all the devices which can function by using a semiconductor characteristic, including an electro-optic device such as a liquid crystal display device or an electroluminescent (EL) display device and an electronic device which includes the electro-optic device as its component.

2. Related Art

In recent years, a technique for forming a TFT (thin film transistor) over a substrate has significantly progressed and application to an active matrix semiconductor display device has been advanced. In particular, since a TFT using a poly-crystalline semiconductor film has higher electric-field effect mobility (also referred to as mobility simply) than a TFT using a conventional amorphous semiconductor film, high-speed operation is possible. Therefore, such a technique has been developed that a pixel, which has been conventionally controlled by a driver circuit provided outside a substrate, is controlled by a driver circuit formed over the same substrate as the pixel.

A substrate used for a semiconductor device is expected to be a glass substrate rather than a single-crystal silicon substrate in terms of cost. A glass substrate is easily deformed due to heat because of low heat resistance; therefore, in the case of forming a poly-silicon TFT over a glass substrate, laser annealing is often employed for crystallizing a semiconductor film in order to prevent the glass substrate from being deformed due to the heat.

Compared with another annealing method using radiant heat or conductive heat, a laser annealing method has advantages that a process time can be drastically shortened and that a semiconductor substrate or a semiconductor film over a substrate can be selectively and locally heated so a thermal damage is hardly given to the substrate.

The laser annealing method described here includes a technique for recrystallizing an amorphous layer formed in a semiconductor substrate or a semiconductor film, a technique for crystallizing an amorphous semiconductor film formed over a substrate, and a technique applied to flattening or modification of a surface of a semiconductor substrate or a semiconductor film.

In the case of conducting laser annealing, the following method is often used for its high mass-productivity and industrial superiority: a laser beam emitted from a high-output pulsed laser such as an excimer laser is shaped by an optical system into a square spot with several cm on a side or a linear spot with 10 cm or more in length on an irradiation surface, and then an irradiation position of the beam spot is moved relative to the irradiation surface (for example, Reference 1: Japanese Patent Application Laid-Open No. H8-195357).

In particular, when a linear beam spot is employed, unlike the case of using a dot-like beam spot which is required to move from front to back and from side to side, the whole surface of an irradiation surface can be irradiated with a laser beam by moving the linear beam spot only in a direction perpendicular to a direction of the line of the linear beam spot (hereinafter, the direction perpendicular to the direction of the line of the linear beam spot referred to as a width direction). Therefore, high mass productivity can be obtained. Here, the linear beam spot is a rectangular beam spot having a high aspect ratio. The beam spot is moved in a direction of its width because this is the most efficient scanning direction. Because of this high mass productivity, a laser beam emitted from a pulsed excimer laser which is shaped into a linear beam spot by an appropriate optical system has been mainly employed in a current laser annealing step.

With the increase in output power of a laser oscillator in recent years, it has become possible to form a longer linear beam spot than before. Accordingly, the size of a substrate used in laser annealing has become larger and larger. This is because throughput is higher and cost is lower when plural semiconductor devices such as panels for liquid crystal display devices or EL display devices are manufactured with one large substrate than when one semiconductor device such as a panel for a liquid crystal display device or an EL display device is manufactured with one substrate. As a large substrate, for example, a substrate with a size of 600 mm×720 mm, a circular substrate of 12 inch (a diameter of approximately 300 mm), or the like can be used. In the future, a substrate with a size of 2,000 mm or more on a side is considered to be used.

However, for example, an optical path length in an optical system for forming a linear beam spot with a length of 300 mm is as long as 5,000 mm. An optical system having such a long optical path length has problems in that optical alignment is very difficult and an apparatus becomes large because of its large footprint.

If the same optical system is designed so as to have a shorter optical path length, the obtained linear beam spot has, for example, a barrel-like shape or a bobbin-like shape. This is because a point of focus is displaced at opposite ends of the linear beam spot in a direction of its line.

Here, a cause of displacing the point of focus is described. A laser beam entering a lens 2001 obliquely has a longer optical path length than a laser beam entering a lens vertically. Moreover, as an incidence angle of the laser beam entering the lens obliquely becomes larger, an optical path difference increases with respect to the laser beam entering the lens vertically. This difference of the optical path length due to an incident position and an incidence angle causes the point of focus to displace, resulting in that an image blurs as going toward an end of the linear beam spot. In other words, a curved field at which an image is formed on a curved surface as shown in FIG. 14 occurs. Homogeneous annealing cannot be conducted even though an irradiation surface 2002 is annealed with such a beam spot.

With the increase in the substrate size, formation of a beam spot with a length of approximately 1,000 mm in a long-side direction is needed urgently. For example, in the case of conducting annealing to a large substrate such as a substrate with a size of 600 mm×720 mm, the whole surface of the large substrate cannot be annealed only by moving a beam spot having a length of 300 mm in a long-side direction once, and the beam spot needs to be moved at least multiple times; therefore, the throughput decreases. As a result, some regions are annealed multiple times while some other regions are not annealed; therefore, homogeneous annealing cannot be conducted. Consequently, an optical system is designed which forms a linear beam spot having a length of, for example, 1,000 mm which can anneal the whole surface of a large substrate only by moving the linear beam spot in one direction. However, a point of focus is displaced on an irradiation surface at opposite ends of the linear beam spot in a long-side direction.

The cause of the displacement of the point of focus at the opposite ends of the linear beam spot in a direction of its line also results from the curved field occurring when the difference in the optical path length due to the incident position and the incidence angle causes the point of focus to displace, similarly to the cause when the optical path length is shortened. Homogeneous annealing is difficult to conduct with such a beam spot even when the length in the long-side direction is made longer to conduct homogeneous annealing.

SUMMARY OF THE INVENTION

Accordingly, it is an object of the present invention to provide a laser irradiation apparatus which can form a linear beam spot with a shorter optical path length, form a linear beam spot with longer length in a long-side direction, and reduce displacement of a condensing point at opposite ends of the linear beam spot in a direction of its line. Further, it is an object of the present invention to provide a laser irradiation method using such a laser irradiation apparatus and to provide a method for manufacturing a semiconductor device by including the laser irradiation method in a step.

According to one aspect of the present invention, a laser irradiation apparatus comprises a laser oscillator and an optical system for shaping a laser beam emitted from the laser oscillator into a linear beam spot having a long-side direction and a short-side direction, wherein the optical system includes a long-side direction forming cylindrical lens array for dividing the laser beam emitted from the laser oscillator in the long-side direction; a long-side direction superposing cylindrical lens for superposing the laser beams divided by the long-side direction forming cylindrical lens array; a short-side direction forming cylindrical lens array for dividing the laser beam emitted from the laser oscillator in the short-side direction; a short-side direction superposing cylindrical lens for superposing the laser beams divided by the short-side direction forming cylindrical lens array, thereby forming a homogeneous plane; and a short-side direction projecting cylindrical lens for projecting the homogeneous plane to an irradiation surface; wherein the long-side direction superposing cylindrical lens is disposed between the short-side direction superposing cylindrical lens and the short-side direction projecting cylindrical lens, and wherein displacement of a position of the homogeneous plane is generated by the long-side direction superposing cylindrical lens so that a distance from the homogeneous plane to the short-side direction projecting cylindrical lens becomes constant not depending on a field angle of the laser beam.

According to one aspect of the present invention, a laser irradiation apparatus comprises a laser oscillator and an optical system for shaping a laser beam emitted from the laser oscillator into a linear beam spot having a long-side direction and a short-side direction; wherein the optical system includes a long-side direction forming cylindrical lens array for dividing the laser beam emitted from the laser oscillator in the long-side direction; a long-side direction superposing cylindrical lens for superposing the laser beams divided by the long-side direction forming cylindrical lens array; a short-side direction forming cylindrical lens array for dividing the laser beam emitted from the laser oscillator in the short-side direction; a short-side direction superposing cylindrical lens for superposing the laser beams divided by the short-side direction forming cylindrical lens array, thereby forming a homogeneous plane; and a short-side direction projecting cylindrical lens for projecting the homogeneous plane to an irradiation surface; wherein the long-side direction superposing cylindrical lens is disposed between the short-side direction superposing cylindrical lens and the short-side direction projecting cylindrical lens, wherein a position of the homogeneous plane formed by the short-side direction superposing cylindrical lens is formed displacing toward an irradiation surface due to an effect of refraction in the long-side direction superposing cylindrical lens, and wherein a radius of curvature of the long-side direction superposing cylindrical lens is adjusted so that a distance from the homogeneous plane to the short-side direction projecting cylindrical lens becomes constant not depending on a field angle of the laser beam.

According to one aspect of the present invention, a laser irradiation apparatus comprises a laser oscillator and an optical system for shaping a laser beam emitted from the laser oscillator into a linear beam spot having a long-side direction and a short-side direction; wherein the optical system includes a long-side direction forming cylindrical lens array for dividing the laser beam emitted from the laser oscillator in the long-side direction; a long-side direction superposing cylindrical lens for superposing the laser beams divided by the long-side direction forming cylindrical lens array; a short-side direction forming cylindrical lens array for dividing the laser beam emitted from the laser oscillator in the short-side direction; a short-side direction superposing cylindrical lens for superposing the laser beams divided by the short-side direction forming cylindrical lens array, thereby forming a homogeneous plane; and a short-side direction projecting cylindrical lens for projecting the homogeneous plane to an irradiation surface; wherein the long-side direction superposing cylindrical lens is disposed between the short-side direction superposing cylindrical lens and the short-side direction projecting cylindrical lens, and wherein displacement of a position of the homogeneous plane is generated by the long-side direction superposing cylindrical lens so that a distance of a laser beam having a large field angle traveling from the homogeneous plane to the short-side direction projecting cylindrical lens is equal to a distance of a laser beam having a small field angle traveling from the homogeneous plane to the short-side direction projecting cylindrical lens.

In a laser irradiation apparatus of the present invention, a cylindrical lens which is asymmetric along a generatrix thereof is used as a cylindrical lens forming the long-side direction forming cylindrical lens array, and all the cylindrical lenses forming the long-side direction forming cylindrical lens array are designed so that a distance from the homogeneous plane to the short-side direction projecting cylindrical lens becomes constant not depending on a field angle of the laser beam.

In a laser irradiation apparatus of the present invention, a cylindrical lens which is symmetric along a generatrix thereof and a cylindrical lens which is asymmetric along the generatrix thereof are used as cylindrical lenses forming the long-side direction forming cylindrical lens array, and all the cylindrical lenses forming the long-side direction forming cylindrical lens array are designed so that a distance from the homogeneous plane to the short-side direction projecting cylindrical lens becomes constant not depending on a field angle of the laser beam.

According to one aspect of the present invention, a laser irradiation apparatus comprises a laser oscillator; and an optical system for shaping a laser beam emitted from the laser oscillator into a linear beam spot having a long-side direction and a short-side direction; wherein the optical system includes: a long-side direction forming cylindrical lens array for dividing the laser beam emitted from the laser oscillator in the long-side direction; a long-side direction superposing cylindrical lens for superposing the laser beams divided by the long-side direction forming cylindrical lens array; a short-side direction forming cylindrical lens array for dividing the laser beam emitted from the laser oscillator in the short-side direction; a short-side direction superposing cylindrical lens for superposing the laser beams divided by the short-side direction forming cylindrical lens array, thereby forming a homogeneous plane; and a short-side direction projecting cylindrical lens for projecting the homogeneous plane to an irradiation surface; wherein the long-side direction superposing cylindrical lens is disposed between the short-side direction superposing cylindrical lens and the short-side direction projecting cylindrical lens, and wherein displacement of a position of the homogeneous plane is generated by the long-side direction superposing cylindrical lens so that a distance of a laser beam having a large field angle traveling from the homogeneous plane to the short-side direction projecting cylindrical lens is shorter than a distance of a laser beam having a small field angle traveling from the homogeneous plane to the short-side direction projecting cylindrical lens.

According to one aspect of the present invention, a laser irradiation method comprises irradiating an irradiation surface with a linear beam spot formed by using the laser irradiation apparatus of the present invention; and moving the linear beam spot relative to the irradiation surface, thereby conducting laser annealing to a whole surface of the irradiation surface.

According to one aspect of the present invention, a method for manufacturing a semiconductor device comprises forming a semiconductor film over a substrate; irradiating the semiconductor film with a linear beam spot formed by using the laser irradiation apparatus of the present invention; and moving the linear beam spot relative to the irradiation surface, thereby conducting laser annealing to a whole surface of the semiconductor film.

According to one aspect of the present invention, a laser irradiation method comprises dividing a laser beam emitted from a laser oscillator in a long-side direction and a short-side direction by passing through a long-side direction forming cylindrical lens array and a short-side direction forming cylindrical lens array; superposing the laser beams divided in the short-side direction by passing through a short-side direction superposing cylindrical lens; superposing the laser beams divided in the long-side direction by passing through a long-side direction superposing cylindrical lens as well as refracting the laser beam which has been superposed in the short-side direction so that a position of a homogeneous plane in the short-side direction is formed closer to an irradiation surface; and projecting the homogeneous plane to the irradiation surface by a short-side direction projecting cylindrical lens and superposing the laser beams divided in the long-side direction on the irradiation surface, so that a linear beam spot having the long-side direction and the short-side direction is delivered to the irradiation surface; wherein a distance from the homogeneous plane to the short-side direction projecting cylindrical lens becomes constant not depending on a field angle of the laser beam.

According to one aspect of the present invention, a laser irradiation method comprises dividing a laser beam emitted from a laser oscillator in a long-side direction and a short-side direction by passing through a long-side direction forming cylindrical lens array and a short-side direction forming cylindrical lens array; superposing the laser beams divided in the short-side direction by passing through a short-side direction superposing cylindrical lens; superposing the laser beams divided in the long-side direction by passing through a long-side direction superposing cylindrical lens as well as refracting the laser beam which has been superposed in the short-side direction so that a position of the homogeneous plane in the short-side direction is formed closer to an irradiation surface; and projecting the homogeneous plane to the irradiation surface by a short-side direction projecting cylindrical lens and superposing the laser beams divided in the long-side direction on the irradiation surface, so that a linear beam spot having the long-side direction and the short-side direction is delivered to the irradiation surface; wherein a radius of curvature of the long-side direction superposing cylindrical lens is adjusted so that a distance from the homogeneous plane to the short-side direction projecting cylindrical lens becomes constant not depending on a field angle of the laser beam.

According to one aspect of the present invention, a laser irradiation method comprises dividing a laser beam emitted from a laser oscillator in a long-side direction and a short-side direction by passing through a long-side direction forming cylindrical lens array and a short-side direction forming cylindrical lens array; superposing the laser beams divided in the short-side direction by passing through a short-side direction superposing cylindrical lens; superposing the laser beams divided in the long-side direction by passing through a long-side direction superposing cylindrical lens as well as refracting the laser beam which has been superposed in the short-side direction so that a position of the homogeneous plane in the short-side direction is formed closer to an irradiation surface; and projecting the homogeneous plane to the irradiation surface by a short-side direction projecting cylindrical lens and superposing the laser beams divided in the long-side direction on the irradiation surface, so that a linear beam spot having the long-side direction and the short-side direction is delivered to the irradiation surface; wherein the homogeneous plane is formed so that a distance of a laser beam having a large field angle traveling from the homogeneous plane to the short-side direction projecting cylindrical lens is equal to a distance of a laser beam having a small field angle traveling from the homogeneous plane to the short-side direction projecting cylindrical lens.

In a laser irradiation method of the present invention, a cylindrical lens which is asymmetric along a generatrix thereof is used as a cylindrical lens forming the long-side direction forming cylindrical lens array, and all the cylindrical lenses forming the long-side direction forming cylindrical lens array are designed so that a distance from the homogeneous plane to the short-side direction projecting cylindrical lens becomes constant not depending on a field angle of the laser beam.

In a laser irradiation method of the present invention, a cylindrical lens which is symmetric along a generatrix thereof and a cylindrical lens which is asymmetric along the generatrix thereof are used as cylindrical lenses forming the long-side direction forming cylindrical lens array, and all the cylindrical lenses forming the long-side direction forming cylindrical lens array are designed so that a distance from the homogeneous plane to the short-side direction projecting cylindrical lens becomes constant not depending on a field angle of the laser beam.

According to one aspect of the present invention, a laser irradiation method comprises dividing a laser beam emitted from a laser oscillator in a long-side direction and a short-side direction by passing through a long-side direction forming cylindrical lens array and a short-side direction cylindrical lens array; superposing the laser beams divided in the short-side direction by passing through a short-side direction superposing cylindrical lens; superposing the laser beams divided in the long-side direction by passing through a long-side directions superposing cylindrical lens as well as refracting the laser beam which has been superposed in the short-side direction so that a position of the homogeneous plane in the short-side direction is formed closer to an irradiation surface; and projecting the homogeneous plane to the irradiation surface by a short-side direction projecting cylindrical lens and superposing the laser beams divided in the long-side direction on the irradiation surface, so that a linear beam spot having the long-side direction and the short-side direction is delivered to the irradiation surface; wherein the homogeneous plane is formed so that a distance of a laser beam having a large field angle traveling from the homogeneous plane to the short-side direction projecting cylindrical lens is shorter than a distance of a laser beam having a small field angle traveling from the homogeneous plane to the short-side direction projecting cylindrical lens.

According to one aspect of the present invention, a method for manufacturing a semiconductor device comprising forming a semiconductor film over a substrate; irradiating the semiconductor film with a linear beam spot by using the laser irradiation method of the present invention; and moving the linear beam spot relative to the semiconductor film, thereby conducting laser annealing to a whole surface of the semiconductor film.

In the present invention, the laser oscillator may be an excimer laser, a YAG laser, a glass laser, a YVO$_4$ laser, a YLF laser, or an Ar laser.

In the present invention, an optical system for shaping a laser beam has a long-side direction superposing cylindrical lens (hereinafter also referred to as a long-side direction condensing cylindrical lens) disposed between a short-side direction superposing cylindrical lens (hereinafter also referred to as a first short-side direction condensing cylindrical lens) and a short-side direction projecting cylindrical lens (hereinafter also referred to as a second short-side direction condensing cylindrical lens). The long-side direction condensing cylindrical lens which is a convex lens (a long-side direction condensing convex cylindrical lens) has a different thickness depending on a position where a laser beam passes. Here, a position of a homogeneous plane formed by the first short-side direction condensing cylindrical lens is displaced in a direction toward an irradiation surface due to an effect of refraction in the long-side direction condensing convex cylindrical lens. The amount of displacement is large in a region where the thickness of the lens is large. An optical system of the present invention uses this characteristic, and a distance from the homogeneous plane to the second short-side direction condensing cylindrical lens is made constant not depending on a field angle, by intentionally displacing the position of the homogeneous plane with the long-side direction condensing convex cylindrical lens. Accordingly, a focal point of a laser beam can be corresponded onto an irradiation surface or its vicinity without being affected by a curved field over all the regions of the linear beam spot ranging from the center to the end in the long-side direction. Further, with the above structure, a beam spot having longer length in the long-side direction than before can be formed. This is particularly effective when a large substrate is processed. Since an effect due to a field angle of a laser beam can be offset, an optical system having a short optical path length can also be formed. Moreover, since an optical element for compensating the displacement of the point of focus of the laser beam on the irradiation surface, such as a compensator, is not necessary in this optical system, the number of lenses in the optical system can be decreased. Thus, an advantage is obtained in that optical alignment becomes easy. Moreover, since a footprint can be suppressed, an apparatus can be made small. This makes it possible to suppress the cost even though the apparatus is installed in a clean room in which the cost per unit area is very high.

With these advantages, the operating characteristic and the reliability can be enhanced in a semiconductor device typified by an active matrix display device. Further, the cost reduction of a semiconductor device can be achieved.

BRIEF DESCRIPTION OF THE DRAWINGS

In the accompanying drawings:

FIGS. 2A and 2B show an example of a laser irradiation apparatus disclosed by the present invention;

FIG. 3 shows an example of a cylindrical lens array in a laser irradiation apparatus disclosed by the present invention;

FIG. 8 is a cross-sectional view showing an active matrix liquid crystal display device;

FIG. 10 shows an example of an electronic appliance;

DETAILED DESCRIPTION OF THE INVENTION

Figure 1A:
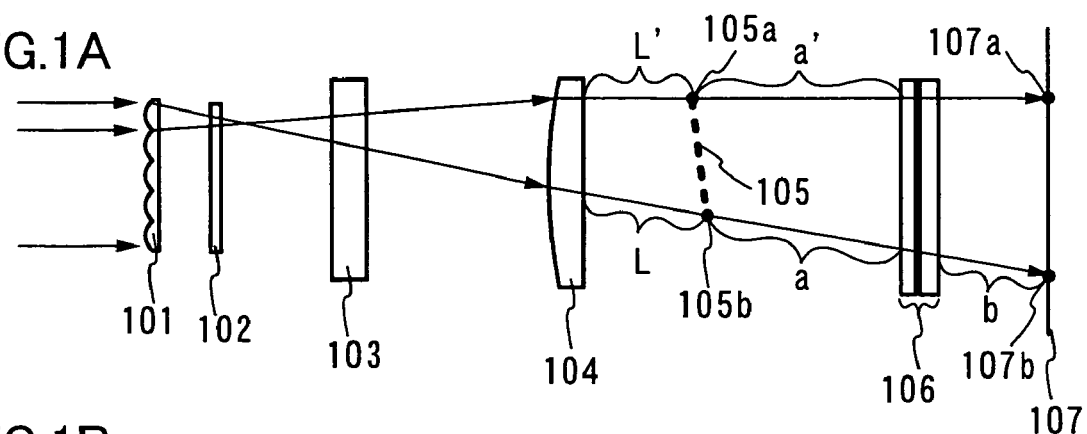
FIGS. 1A to 1C show homogenization of energy distribution by a laser irradiation apparatus disclosed by the present invention.

Embodiment Mode and Embodiments of the present invention are hereinafter described with reference to the drawings. However, the present invention is not limited to the following description, and it is easily understood by those skilled in the art that the mode and detail can be variously changed without departing from the spirit and scope of the present invention. Therefore, the present invention is not construed as being limited to the description of Embodiment Mode and Embodiments hereinafter shown.

A mode of forming a laser beam in accordance with the present invention is described with reference to FIGS. 1A to 1C. First, a method for shaping a laser beam in a long-side direction to obtain a linear beam spot is described with reference to a top view of FIG. 1A. In order to shape the beam spot in the long-side direction, a long-side direction forming cylindrical lens array 101 and a long-side direction condensing convex cylindrical lens 104 are used. The laser beam is formed in a long-side direction by superposing the laser beams divided by the long-side direction forming cylindrical lens array 101 on an irradiation surface.

Next, a method for shaping the laser beam in a short-side direction to obtain the linear beam spot is described with reference to a side view of FIG. 1B. In order to shape the beam spot in the short-side direction, laser beams divided with a short-side direction forming cylindrical lens array 102 are condensed with a first short-side direction condensing cylindrical lens 103, thereby forming a homogenous plane 105 at which the energy distribution of the laser beam in the short-side direction is homogenized. Then, the homogeneous plane 105 is projected onto an irradiation surface 107 with a second short-side direction condensing cylindrical lens 106.

Here, in an optical system of a laser irradiation apparatus by the present invention, the reason why the displacement of a point of focus of a beam spot formed on an irradiation surface can be suppressed is described below in detail. In FIG. 1A, a dot 107a on the irradiation surface is formed by a laser beam having a small field angle in the long-side direction, while a dot 107b on the irradiation surface is formed by a laser beam having a large field angle in the long-side direction. Moreover, a dot 105a on the homogeneous plane is formed by a laser beam having a small field angle, while a dot 105b on the homogeneous plane is formed by a laser beam having a large field angle. FIG. 1C is a side view of the long-side direction condensing convex cylindrical lens 104, which shows the homogeneous plane formed by condensing the laser beam in the short-side direction of the linear beam spot.

Figure 1B:
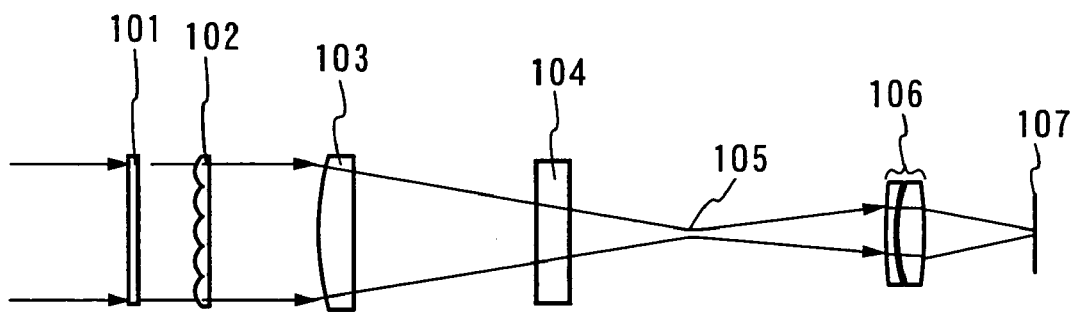
Figure 1C:
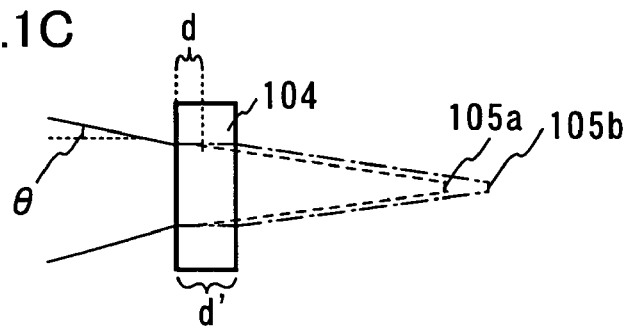

A dashed line in FIG. 1C shows an optical path along which the laser beam for forming the dot 107a on the irradiation surface passes. The optical path of the laser beam is affected by the refraction in the long-side direction condensing convex cylindrical lens 104; therefore, the homogeneous plane is formed in a position displaced toward the irradiation surface as compared with the homogeneous plane formed without the long-side direction condensing convex cylindrical lens 104. Here, an amount x of the displacement of the homogeneous plane toward the irradiation surface can be approximated from the following formula (1) where d is the thickness of the long-side direction condensing convex cylindrical lens 104.

$$x = d(1 - \cos\theta / \sqrt{n^2 - \sin^2\theta}) \qquad (1)$$

In the formula (1), $\theta$ is an incidence angle of a laser beam entering the long-side direction condensing convex cylindrical lens 104 ($\theta$ in FIGS. 1A to 1C), and n is a refractive index of the long-side direction condensing convex cylindrical lens 104. In FIG. 1C, an optical path shown with a chain line is an optical path along which the laser beam for forming the dot 107b on the irradiation surface passes and also the laser beam having a large field angle in the long-side direction passes. Similarly, the optical path of the laser beam having a large field angle is affected by the refraction in the long-side direction condensing convex cylindrical lens 104; therefore, the homogeneous plane is formed in a position displaced toward the irradiation surface as compared with the homogeneous plane formed without the long-side direction condensing convex cylindrical lens 104. Since the laser beam traveling along the optical path shown with the chain line passes through a central portion of the long-side direction condensing convex cylindrical lens 104, a lens thickness d' of the central portion of the lens is larger than the lens thickness d. Here, since the amount x of the displacement of the homogeneous plane toward the irradiation surface is expressed with the formula (1), the position of the homogeneous plane is displaced farther toward the irradiation surface as the lens thickness increases. It is to be noted that the amount of the displacement of the homogeneous plane can be adjusted by changing the radius of curvature or the like of the long-side direction condensing convex cylindrical lens. For example, when a long-side direction condensing convex cylindrical lens having a radius of curvature of 500 mm and a length of 300 mm in a direction of the curvature is used, the difference between the thickest portion and the thinnest portion of the lens is approximately 40 mm. Therefore, the homogeneous plane can be displaced for approximately several mm to several tens mm.

In this way, when a distance of the laser beam with a large field angle traveling from the long-side direction condensing convex cylindrical lens 104 to the homogeneous plane is assumed to be L and a distance of the laser beam with a small field angle traveling from the long-side direction condensing convex cylindrical lens 104 to the homogeneous plane is assumed to be L' in FIG. 1A, an inequality of L>L' is obtained. With the above structure, the homogeneous plane is formed so as to offset the optical path difference due to the field angle by satisfying L>L'. Thus, the distance from the homogeneous plane 105 to the second short-side direction condensing cylindrical lens 106 can be made constant not depending on the field angle of the laser beam. That is to say, when a distance of a laser beam having a large field angle traveling from the homogeneous plane 105 to the second short-side direction condensing cylindrical lens 106 is assumed to be a and a distance of a laser beam having a small field angle traveling from the homogeneous plane 105 to the second short-side direction condensing cylindrical lens 106 is assumed to be a', a and a' satisfy the relation of a≈a'.

In the above optical system, the homogeneous plane 105 is projected onto the irradiation surface 107 by the second short-side direction condensing cylindrical lens 106. Therefore, a conjugate formula shown with the following formula (2) is obtained.

$$1/f = 1/a + 1/b \qquad (2)$$

In the formula (2), f is a focal distance of the second short-side direction condensing cylindrical lens 106 (the focal distance is assumed to be approximately almost constant not depending on the field angle of the laser beam), a is a distance from the homogeneous plane 105 to the second short-side direction condensing cylindrical lens 106, and b is a distance from the second short-side direction condensing cylindrical lens 106 to the irradiation surface 107. Thus, the point of focus of the laser beam on the irradiation surface can be calculated from the formula (2).

In a conventional optical system, the distance from the homogeneous plane to the second short-side direction condensing cylindrical lens depends on the field angle of the laser beam. For example, when the distance of the laser beam having a large field angle traveling from the homogeneous plane to the second short-side direction condensing cylindrical lens is assumed to be a and the distance of the laser beam having a small field angle traveling from the homogeneous plane to the second short-side direction condensing cylindrical lens is assumed to be a', a and a' satisfy a>a'. Therefore, when a distance of a laser beam having a large field angle traveling from the second short-side direction condensing cylindrical lens to an irradiation point is assumed to be b and a distance of a laser beam having a small field angle traveling from the second short-side direction condensing cylindrical lens to the irradiation point is assumed to be b', b and b' satisfy b<b', which has increased the displacement of the point of focus. However, in a laser irradiation apparatus of the present invention, the distance from the homogeneous plane to the second short-side direction condensing cylindrical lens can be made constant not depending on the field angle by the above method, and a=a' can be obtained. As a result, the distance from the second short-side direction condensing cylindrical lens to the irradiation surface can be made b=b'. Thus, the displacement of the point of focus on the irradiation surface can be relaxed.

As described thus, the optical system of the present invention has such a characteristic that the position of the homogeneous plane is intentionally displaced by the long-side direction condensing convex cylindrical lens 104. By using this displacement, the displacement of the distance from the homogeneous plane to the second short-side direction condensing cylindrical lens due to the field angle can be offset so that the point of focus on the irradiation surface is compensated. Another characteristic of the present invention is that an off-axis cylindrical lens, which is asymmetric along its generatrix, is used as a cylindrical lens in the long-side direction forming cylindrical lens array 101. When the off-axis cylindrical lens is used in the cylindrical lens array, the traveling direction of the laser beam can be controlled so as to be a desired direction. Therefore, an advantage is obtained in that an optical system having functions for offsetting the optical path difference due to the field angle and so on can be designed easily. Moreover, the long-side direction condensing convex cylindrical lens 104 can have smaller radius of curvature, that is, a cylindrical lens having largely different thicknesses in its central portion and end portion can be used. Accordingly, the displacement of the homogeneous plane can be generated easily. In this way, though not shown in FIGS. 1A to 1C, all the cylindrical lenses forming the cylindrical lens array are designed similarly so that the distance from the homogeneous plane 105 to the second short-side direction condensing cylindrical lens 106 becomes equal. With the above structure, the displacement of the focal point on the irradiation surface can be relaxed. When laser annealing is conducted, the focal point of the beam spot preferably comes within the range of the focal depth in which the process can be conducted appropriately.

When a long beam spot is formed or an optical path length is shortened, a field angle of a laser beam in a long-side direction increases. Therefore, in some cases, the curved field of a point of focus on an irradiation surface cannot be decreased sufficiently only by making the distance from the homogeneous plane 105 to the second short-side direction condensing cylindrical lens 106 constant. In such a case, the distance from the homogeneous plane 105 to the second short-side direction condensing cylindrical lens 106 is preferably adjusted by optimizing the radius of curvature of the long-side direction condensing convex cylindrical lens, the structure of the off-axis cylindrical lens array, or the like, so that the distance a of the laser beam having the large field angle is shorter than the distance a' of the laser beam having the small field angle. In this case, since a<a', it is understood from the formula (2) that b>b' where b is the distance of the laser beam having the large field angle traveling from the second short-side direction condensing cylindrical lens to the irradiation point and b' is the distance of the laser beam having the small field angle traveling from the second short-side direction condensing cylindrical lens to the irradiation point. Thus, the point of focus can be corresponded to the irradiation surface or its vicinity so as to compensate the curved field.

The width of the beam spot on the irradiation surface in its short-side direction can be obtained from the formula (2) and is determined by the width thereof in its short-side direction on the homogeneous plane and the magnification b/a. Here, when the distance from the homogeneous plane to the second short-side direction condensing cylindrical lens is changed depending on the field angle of the laser beam by, for example, setting a and a' so as to satisfy a<a', the above magnification varies. Therefore, it is expected that the width of the linear beam spot on the irradiation surface in its short-side direction is different in the central portion and the end portion in the long-side direction of the linear beam spot. However, when a footprint of an optical system used in a laser irradiation apparatus and the like are considered, the fluctuation in width of the beam spot in the short-side direction is approximately ±1% at the highest. This fluctuation is ignorable because it has little effects on the characteristic in the case of conducting laser annealing to a semiconductor film, for example.

A more significant advantage obtained by using a method for conforming the point of focus to the irradiation surface is that the point of focus can be formed on the irradiation surface or its vicinity in all the regions from the center to the end of the beam spot. The beam spot on the irradiation surface is formed by superposing the laser beams divided by the cylindrical lens array. However, since the beam spots cannot be superposed completely at a position out of the focal point, the fluctuation of the energy distribution of the beam spot becomes remarkable. Therefore, laser anneal cannot be conducted properly. However, in a laser irradiation apparatus of the present invention, since the focal point can be conformed to the irradiation surface or its vicinity, laser irradiation can be conducted stably. Moreover, the laser anneal process can be conducted homogeneously within the surface of the substrate.

The above method is to relax the displacement of the point of focus on the irradiation surface due to the field angle, by actively using the displacement of the homogeneous plane. An optical system in the present invention uses this knowledge. Therefore, since it is not necessary to relax the field angle of the laser beam with the optical system of the present invention, the size of each lens in the optical system can be reduced. For example, as a method for relaxing the field angle of the laser beam, such a method has been known conventionally that the laser beam is extended long once to the length of the beam spot in the long-side direction formed on the irradiation surface and then the laser beam passes through the optical system. However, in this method, the lens included in the optical system needs to be longer than the length of the linear beam spot in the long-side direction obtained on the irradiation surface. However, in the laser irradiation apparatus of the present invention, the off-axis cylindrical lens array is used, whereby the optical system can be designed while controlling the traveling direction of the ray easily. Even in the case where the laser beam has a large field angle, it is possible to compensate the point of focus by using a long-side direction condensing convex cylindrical lens having small radius of curvature. Therefore, a longer linear beam spot can be formed even by using a lens which is a shorter than the length of the long-side direction of the beam spot.

The present invention is to optimize an optical path of a laser beam so as to offset the displacement of a point of focus of a beam spot formed on an irradiation surface in an optical system for forming a linear beam spot, as mentioned above. Therefore, an optical path difference due to the field angle of the laser beam generated between the homogeneous plane and the second short-side direction condensing cylindrical lens 106 can be offset. Further, the displacement of the focal point on the irradiation surface can be relaxed. Therefore, even when the field angle of the laser beam is so large that the curved field is remarkable on the irradiation surface, it is possible to conform the focal point of the center of the linear beam spot in its long-side direction to that of the end portion thereof in its long-side direction on the irradiation surface or its vicinity.

Another mode of a laser irradiation apparatus of the present invention is hereinafter described in more detail with reference to FIGS. 2A and 2B and FIG. 3. Here, an optical system for shaping a laser beam emitted from a laser into a beam spot having a length of 300 mm is described; however, the length of the beam spot is not limited to 300 mm and the present invention can also be applied to the case where the beam spot has a length shorter or longer than 300 mm.

In this specification, the arrangement of the lenses is described assuming that a traveling direction of a laser beam is a front. Moreover, a surface of a lens to which a laser beam is incident is referred to as a first surface, and a surface thereof from which the laser beam is emitted is referred to as a second surface. The sign of radius of curvature is negative when the center of curvature is on an incident side of the laser beam with respect to the lens and positive when the center of curvature is on an emission side of the laser beam with respect to the lens. When the surface is plane, the sign is 8. Moreover, all the lenses are made of synthetic quartz glass (refractive index 1.485634); however the present invention is not limited to this. The lenses can be applied to various lasers by changing a coating material on the surface of the synthetic quartz glass in accordance with the wavelength of the laser.

A top view of FIG. 2B is described. A laser beam emitted from a laser oscillator 201 travels in a direction indicated by an arrow in FIGS. 2A and 2B. The laser beam is expanded in both of a long-side direction and a short-side direction so as to have approximately a double size by a beam expander including spherical lenses 202a and 202b. The spherical lens 202a has a radius of 50 mm, a thickness of 7 mm, and a first surface with a radius of curvature of −220 mm. The spherical lens 202b has a radius of 50 mm, a thickness of 7 mm, and a second surface with a radius of curvature of −400 mm. The beam expander is particularly effective when the laser beam emitted from the laser has a small shape, and is not necessarily used depending on the size and the like of the laser beam. Then, the laser beam passed through the beam expander is divided in a short-side direction by short-side direction forming cylindrical lens arrays 203a and 203b. The short-side direction forming cylindrical lens array 203a has eight cylindrical lenses arranged in a direction of its curvature, each of which has a thickness of 5 mm, a width of 4 mm, and a first surface with a radius of curvature of +200 mm. The short-side direction forming cylindrical lens array 203b has eight cylindrical lenses arranged in a direction of its curvature, each of which has a thickness of 5 mm, a width of 4 mm, and a first surface with a radius of curvature of −160 mm. The short-side direction forming cylindrical lens array 203a is disposed at 2,927 mm from the irradiation surface, and the distance between the short-side direction forming cylindrical lens arrays 203a and 203b is set 150 mm.

After that, the laser beam is condensed by a first short-side direction condensing cylindrical lens 205 which has a thickness of 20 mm and a first surface with a radius of curvature of +486 mm and which is disposed at 301 mm from the short-side direction forming cylindrical lens array 203b toward the irradiation surface. Thus, the rays passed through the respective arrays are condensed at one position. This makes it possible to homogenize the energy distribution of the beam spot in the short-side direction and to project the homogeneous plane to the irradiation surface, so that a beam spot having homogenous energy distribution is formed. To project the beam, a second short-side direction condensing cylindrical lens 207 is disposed closer to the irradiation surface than to the first short-side direction condensing cylindrical lens 205. Then, a long-side direction condensing cylindrical lens 206 is disposed between the first short-side direction condensing cylindrical lens 205 and the second short-side direction condensing cylindrical lens 207. The long-side direction condensing cylindrical lens has different thickness depending on the position where the laser beam passes. Here, the homogeneous plane formed by the first short-side direction condensing cylindrical lens 205 is affected by refraction in the long-side direction condensing cylindrical lens 206, causing the homogeneous plane to displace toward the irradiation surface. The amount of the displacement is remarkable in a region where the lens has a large thickness. By using this characteristic, the position of the homogeneous plane is intentionally displaced by the long-side direction condensing cylindrical lens 206, so that the distance from the homogeneous plane to the second short-side direction condensing cylindrical lens 207 can be made constant not depending on the field angle.

In order to project the beam, a doublet cylindrical lens is disposed as the second short-side direction condensing cylindrical lens 207 at 2,180 mm from the first short-side direction condensing cylindrical lens 205 toward the irradiation surface. Here, the doublet cylindrical lens is a lens including two cylindrical lenses. The above doublet cylindrical lens includes a cylindrical lens 207a and a cylindrical lens 207b. The cylindrical lens 207a has a thickness of 10 mm, a first surface with a radius of curvature of +125 mm, and a second surface with a radius of curvature of +77 mm. The cylindrical lens 207b has a thickness of 20 mm, a first surface with a radius of curvature of +97 mm, and a second surface with a radius of curvature of −200 mm. The distance between the two cylindrical lenses 207a and 207b is 5.5 mm. This makes it possible to homogenize the energy distribution of the beam spot of the laser beam in its short-side direction and determine the length in the short-side direction. The doublet cylindrical lens is not necessarily used; however, spatial margin can be secured by using the doublet cylindrical lens because enough distance can be obtained between the optical system and the irradiation surface. The beam is condensed on an irradiation surface 208 disposed at 230 mm from the doublet cylindrical lens on the optical path. Thus, a beam having homogeneous energy distribution in a short-side direction can be formed.

Next, a top view of FIG. 2A is described. A beam spot of the laser beam emitted from the laser oscillator 201 is divided in a long-side direction by a long-side direction forming cylindrical lens array 204. The long-side direction forming cylindrical lens array 204 is disposed at 206 mm from the short-side direction forming cylindrical lens array 203b toward the irradiation surface. After that, the laser beams are combined into one on the irradiation surface 208 by the long-side direction condensing cylindrical lens 206 which has a thickness of 40 mm and a first surface with a radius of curvature of +360 mm and which is disposed at 310 mm from the long-side direction forming cylindrical lens array 204 toward the irradiation surface. This makes it possible to homogenize the energy distribution of the beam spot of the laser beam in its long-side direction and to determine the length of the beam spot in the long-side direction. Here, the long-side direction forming cylindrical lens array 204 has eleven cylindrical lenses arranged in a direction of its curvature, each of which has a thickness of 5 mm, a width of 10 mm, and a first surface with a radius of curvature of +22 mm. FIG. 3 is a top view showing the long-side direction forming cylindrical lens array 204. A cylindrical lens 3001 disposed in the center of the long-side direction forming cylindrical lens array 204 is a normal cylindrical lens which is symmetric along its generatrix. On the other hand, the other ten cylindrical lenses are asymmetric along its generatrix. Each of the cylindrical lenses 3002 and 3003 is manufactured so that its generatrix is displaced by 0.5 mm from the center line of the lens to the outside of the lens in the direction of the width of the lens. In the same way, the generatrices of the cylindrical lenses 3004 and 3005 are displaced by 1.0 mm from the center line to the outside in the direction of the width, the generatrices of the cylindrical lenses 3006 and 3007 are displaced by 1.6 mm from the center line to the outside in the direction of the width, the generatrices of the cylindrical lenses 3008 and 3009 are displaced by 2.2 mm from the center line to the outside in the direction of the width, and the generatrices of the cylindrical lenses 3010 and 3011 are displaced by 2.9 mm from the center line to the outside in the direction of the width. The traveling direction of the ray can be freely controlled by displacing the generatrix of each lens of the long-side direction forming cylindrical lens array 204. With the above structure; all the rays passed through the long-side direction forming cylindrical lens array 204 and the long-side direction condensing cylindrical lens 206 can be condensed onto the same region on the irradiation surface.

Figure 4:
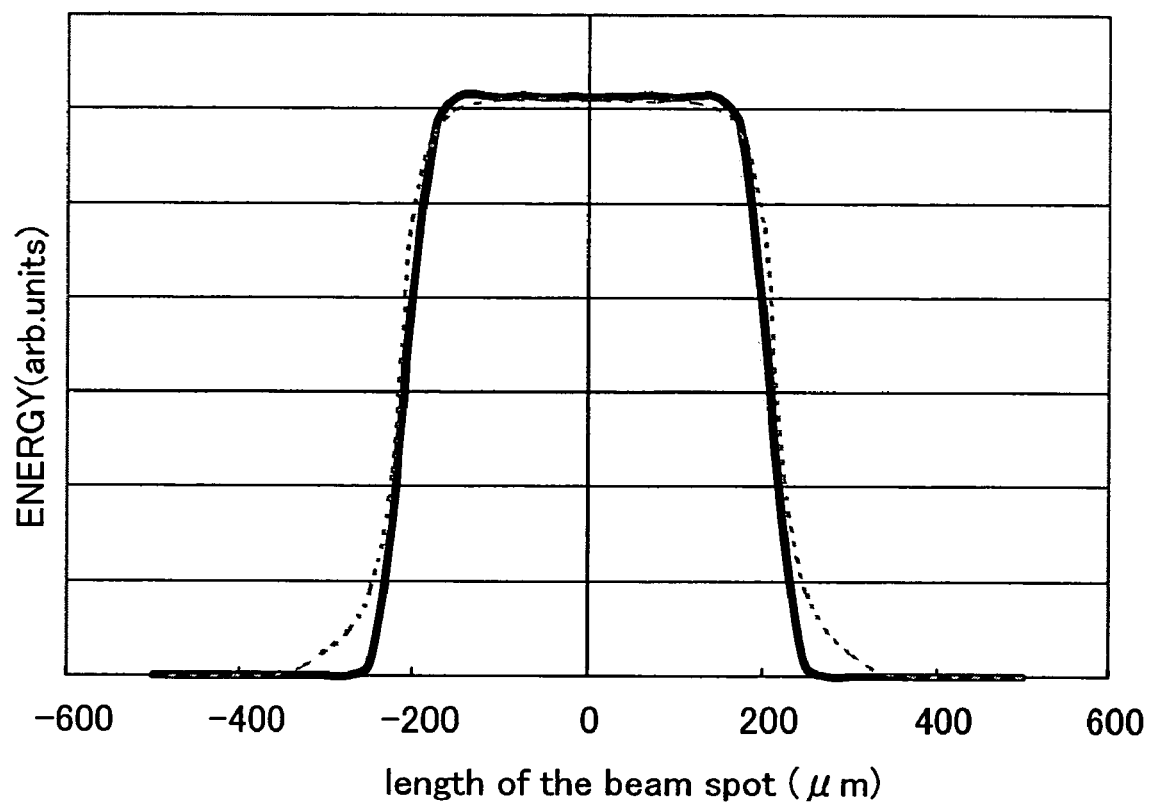
FIG. 4 shows an example of energy distribution of a beam spot.

Moreover, the focal point of the beam spot formed on the irradiation surface can be disposed on the irradiation surface or its vicinity not depending on the position of the beam spot in its long-side direction. FIG. 4 shows a calculation result of the energy distribution of the beam spot on the irradiation surface 208 formed by such an optical system. In FIG. 4, a solid line shows energy distribution in a central portion of the beam spot in its long-side direction while a dotted line shows energy distribution at 150 mm from the central portion. It is understood from FIG. 4 that the width in the short-side direction is almost equal in the central portion and end portion of the beam spot in the long-side direction. This corresponds to that the condensing point conforms on the irradiation surface.

In this embodiment mode, a planoconvex cylindrical lens whose first surface has positive curvature is used as the long-side direction condensing cylindrical lens; however, the present invention is not limited to this. A biconvex cylindrical lens whose first surface has positive curvature and second surface has negative curvature or the like may also be used. Besides, a crossed cylindrical lens manufactured in such a way that the first short-side direction condensing lens has a second surface with negative curvature in a direction parallel to a long-side direction can also be used.

Although the linear beam spot whose shape is linear on the irradiation surface is used in this embodiment mode, the present invention is not limited to the linear shape. For example, the short-side direction forming cylindrical lens arrays 203a and 203b have a function to reduce the size of the laser beam in the short-side direction in FIGS. 2A and 2B. However, if the short-side direction forming cylindrical lens array 203b is removed, the laser beam does not reduce in size; therefore, a beam spot having a lower aspect ratio than the beam spot formed by the optical system shown in FIGS. 2A and 2B is formed. The shape of the laser beam emitted from the laser is different depending on the kind of lasers, and the beam spot shaped by the optical system is easily affected by the original shape. For example, a laser beam emitted from a XeCl excimer laser (wavelength 308 nm, a pulse width 30 ns) has a rectangular shape with a size of 10 mm×30 mm (both are a full width at half maximum in a beam profile). A laser beam emitted from a solid-state laser is circular when the rod shape is cylindrical and the laser beam is rectangular when the rod shape is slab. In any case, there are no problems when the laser beam has enough energy density to anneal the irradiation object, and both can be employed in the present invention.

As the laser oscillator used in the laser irradiation apparatus of the present invention, a laser oscillator having high output power and a wavelength range which is sufficiently absorbed in a semiconductor film is preferable. In the case of using a silicon film as a semiconductor film, it is preferable that the wavelength of the laser beam emitted from the laser oscillator be 600 nm or shorter in consideration of the absorption ratio of amorphous silicon. As the laser oscillator emitting such a laser beam, for example, an excimer laser, a YAG laser (harmonic), a glass laser (harmonic), and the like are given. Although high output power is not yet obtained with a current technique, for example, a $YVO_4$ laser (harmonic), a YLF laser (harmonic), an Ar laser, and the like are given as laser oscillators for emitting laser beams with wavelengths appropriate for the crystallization of a silicon film.

Next, a case of manufacturing a semiconductor device is described as a mode of using a laser irradiation apparatus of the present invention. First, a glass substrate having a size of 600×720×0.7 mm is prepared. A substrate having enough resistance against heat up to 600° C. is used as this glass substrate. Over the glass substrate, a silicon oxide film with a thickness of 200 nm is formed as a base film. Further, an amorphous silicon film is formed thereover in 55 nm thick. These films are formed by a sputtering method or a plasma CVD method.

The substrate where the films have been formed is heated in a nitrogen atmosphere at 450° C. for one hour. This step is to decrease the hydrogen concentration in the amorphous silicon film. This step is conducted because the film cannot resist the laser energy when the film contains too much hydrogen. The hydrogen concentration of the film is appropriate at approximately $10^{20}/cm^3$. Here, $10^{20}/cm^3$ means $10^{20}$ number of hydrogen atoms exist in 1 $cm^3$.

In this specific example of the manufacturing method, STEEL 1000 (XeCl excimer laser) manufactured by Lambda Physik, Inc. is used as the laser oscillator. This excimer laser is a pulsed laser oscillator having a maximum energy of 1,000 mJ per pulse, an emission wavelength of 308 nm, and a maximum repetition rate of 300 Hz. When the energy of the pulsed laser beam fluctuates within ±5%, preferably within ±2%, in each pulse during the laser processing performed to one substrate, it is possible to perform homogeneous crystallization. The fluctuation of the laser energy described here is defined as follows. An average value of the laser energy in a period of the irradiation to one substrate is assumed to be standard. Then, the fluctuation of the laser energy is defined as a value expressing a difference between the average value and the maximum or minimum value in the period of the irradiation in percentage terms.

The laser beam irradiation is conducted in such a way that, for example, a stage with the irradiation surface 208 shown in FIGS. 2A and 2B mounted thereover is moved in a short-side direction of a rectangular beam spot. At the laser irradiation, a process condition such as the energy density and the scanning speed of the beam spot on the irradiation surface may be appropriately determined. The energy density is appropriate in the range of 300 to 1,000 $mJ/cm^2$, and the scanning speed is selected from the range where the width of the rectangular beam spot in its short-side direction is overlapped one another by approximately 90% or more. Then, it is feasible to perform laser annealing homogeneously. The optimum scanning speed depends on the pulse repetition rate of the laser oscillator, and may be regarded to be proportional to the pulse repetition rate thereof.

By performing the process as above, the laser annealing step is completed. By repeating the above step, many substrates can be processed. The substrate processed thus can be utilized to manufacture an active matrix liquid crystal display and an EL display device by a known method. The above-mentioned manufacturing method uses the excimer laser as the laser oscillator. Since the excimer laser has a coherent length as short as several μm, the excimer laser is suitable for the optical system in the above example.

Although some of the lasers shown below have the long coherent length, the laser whose coherent length is changed deliberately may be employed. It is also preferable to use a harmonic of a YAG laser or a harmonic of a glass laser because they also have high output power and energy which is sufficiently absorbed in the silicon film. As the laser oscillator appropriate for the crystallization of the silicon film, a $YVO_4$ laser (harmonic), a YLF laser (harmonic), an Ar laser, and the like are given. The wavelengths of these laser beams are sufficiently absorbed in the silicon film.

The specific example in the above method for manufacturing a semiconductor device uses the amorphous silicon film as the non-single crystal semiconductor film. However, it is easily supposed that the present invention can be applied to other non-single crystal semiconductor films. For example, a compound semiconductor film having an amorphous structure, for example an amorphous silicon germanium film may be used as the non-single crystal semiconductor film. Further, a poly-crystalline silicon film may be used as the non-single crystal semiconductor film.

Next, the present invention is described in more detail showing an embodiment for manufacturing a semiconductor device.

Embodiment 1

A procedure for manufacturing a TFT using the present invention is hereinafter described simply with reference to FIGS. 5A to 5E.

Figure 5A:
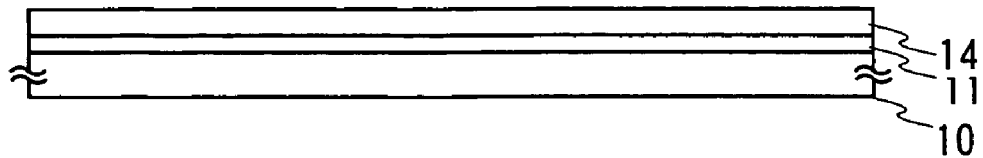
FIGS. 5A to 5E are cross-sectional views showing steps for manufacturing a TFT.

In FIG. 5A, a reference numeral 10 denotes a substrate having an insulating surface; 11, an insulating film to become a blocking layer; and 14, a semiconductor film having a crystal structure by the irradiation with a laser beam.

In FIG. 5A, the substrate 10 may be a glass substrate, a quartz substrate, a ceramic substrate, or the like. Further, a silicon substrate, a metal substrate, or a stainless steel substrate each having an insulating film formed thereover may be used. Furthermore, a heat-resistant plastic substrate which can resist process temperature of this step may be used.

First, as shown in FIG. 5A, a base insulating film 11 including an insulating film such as a silicon oxide film, a silicon nitride film, or a silicon oxynitride film ($SiO_xN_y$: x>y>0) is formed over the substrate 10. As a typical example, the base insulating film 11 has a two-layer structure in which a silicon nitride oxide film with a thickness from 50 to 100 nm formed by using $SiH_4$, $NH_3$, and $N_2O$ as reactive gas and a silicon oxynitride film with a thickness of 100 to 150 nm formed by using $SiH_4$ and $N_2O$ as reactive gas. It is preferable to use a silicon nitride film (SiN film) or a silicon nitride oxide film ($SiN_xO_y$: x>y>0) with a thickness of 10 nm or less as a layer of the base insulating film 11. Moreover, a three-layer structure formed by sequentially stacking a silicon nitride oxide film, a silicon oxynitride film, and a silicon nitride film may also be used.

Next, a semiconductor film having an amorphous structure is formed over the base insulating film. The semiconductor film is formed with a semiconductor material containing silicon as its main component. Typically, an amorphous silicon film or an amorphous silicon germanium film is formed by a known means (such as a sputtering method, an LPCVD method, or a plasma CVD method) in a thickness from 25 to 80 nm (preferably from 30 to 60 nm). In this embodiment, an amorphous silicon film is formed in 55 nm thick by a plasma CVD method. Next, a semiconductor film having a crystal structure is obtained by conducting a crystallization process. This crystallization process is conducted by using the laser crystallization method shown in Embodiment Mode of the present invention. The laser crystallization method may be conducted alone or may be conducted in combination with a known crystallization process (such as RTA, a thermal crystallization method using an anneal furnace or the like, or a thermal crystallization method using a catalyst such as nickel).

FIG. 5A shows a process cross-sectional view in which a crystalline silicon film is formed by a laser crystallization method by applying a laser irradiation method of the present invention to the semiconductor film 14. By this step, a semiconductor film having a crystal structure can be obtained. Further, in order to increase the degree of crystallinity of the semiconductor film having a crystal structure obtained by other method than the laser crystallization method shown in FIG. 5A, the step of irradiating with the laser beam of the present invention may be conducted. In such a case, it is preferable to remove a naturally-formed oxide film on the surface before the laser irradiation. As the laser irradiation method, the method shown in Embodiment Mode of the present invention is preferably employed.

As the laser oscillator used at the laser irradiation, a laser oscillator being able to emit ultraviolet light, visible light, or infrared light can be used. As the laser oscillator, an excimer laser such as an KrF excimer laser, an ArF excimer laser, a KrF excimer laser, a XeCl excimer laser, or a Xe excimer laser; a gas laser such as a He laser, a He—Cd laser, an Ar laser, a He—Ne laser, or a HF laser; a solid-state laser in which a crystal of YAG, $GdVO_4$, $YVO_4$, YLF, $YAlO_3$, or the like is doped with Cr, Nd, Er, Ho, Ce, Co, Ti, or Tm; or a semiconductor laser such as a GaN laser, a GaAs laser, a GaAlAs laser, or a InGaAsP laser can be used. As the solid-state laser, it is preferable to use first to fifth harmonics of a fundamental wave.

Typically, an excimer laser beam having a wavelength of 400 nm or shorter, or a second or third harmonic of a YAG laser is used as the laser beam. For example, a pulsed laser beam having a repetition rate of approximately 10 Hz to 100 MHz is used.

In the case of using these lasers, a method is used in which a laser beam emitted from the laser oscillator is condensed so as to be linear by an optical system and is delivered to a semiconductor film. The condition of the crystallization is selected appropriately. However, when an excimer laser is used, the pulse repetition rate is set in the range of 30 to 300 Hz and the laser energy density is set in the range of 100 to 800 mJ/cm$^2$ (typically 200 to 700 mJ/cm$^2$). In the case of using a YAG laser, it is preferable that the second harmonic be used, the repetition rate be set in the range of 1 to 10,000 Hz, and the laser energy density be set in the range of 300 to 1,000 mJ/cm$^2$ (typically 350 to 800 mJ/cm$^2$). Then, the laser beam condensed to be linear so as to have a width of 100 to 1,000 μm, for example 400 μm, is delivered to the whole surface of the substrate.

Figure 5B:
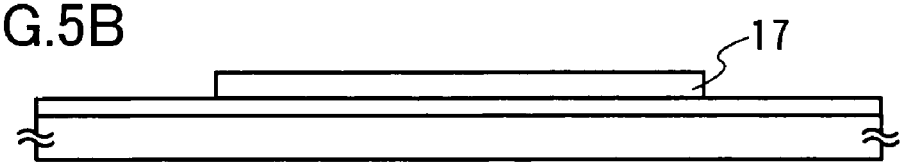

Next, selective etching is conducted by using a photolithography technique to obtain a semiconductor layer 17 (FIG. 5B). Before a resist mask used at the etching is formed, an oxide film is formed by generating ozone with the use of an ozone-containing water solution or UV irradiation in an oxygen atmosphere in order to protect the semiconductor layer. Here, the oxide film also has an advantageous effect to increase the wettability of the resist.

If necessary, a small amount of impurity elements (boron or phosphorus) is added through the oxide film in order to control a threshold value of a TFT before the selective etching. In the case of conducting the doping through the oxide film, the oxide film is removed and another oxide is formed again by an ozone-containing water solution.

Figure 5C:
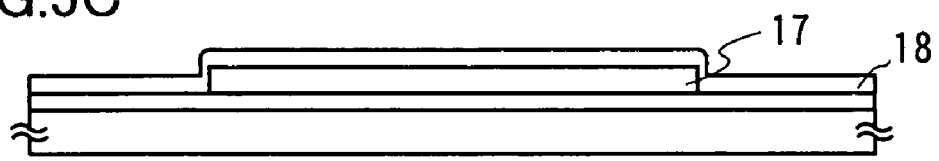
Figure 5D:
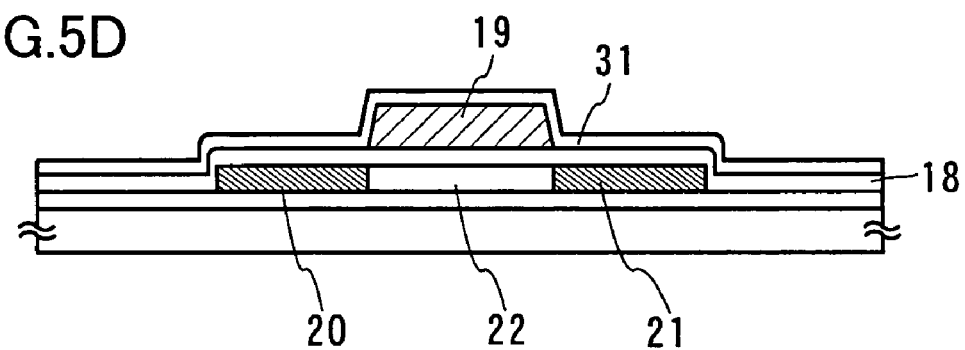

Subsequently, an insulating film containing silicon as its main component is formed as a gate insulating film 18 so as to cover the surface of the semiconductor layer 17 (FIG. 5C). Here, in order to decrease the number of steps, the gate insulating film 18 is formed without removing the oxide film. The oxide film may be removed by etchant containing fluorinated acid before forming the gate insulating film 18. The oxide film on the semiconductor layer 17 is not necessarily removed completely, and the oxide film may be remained thinly. If the etching is conducted excessively to expose the semiconductor layer 17, the surface of the semiconductor layer 17 may be contaminated with an impurity.

Next, after washing the surface of the gate insulating film 18, a gate electrode 19 is formed. Then, an impurity element imparting n-type conductivity (such as P or As), here phosphorus, is added appropriately to form a source region 20 and a drain region 21 and define a channel formation region 22. Subsequently, an interlayer insulating film 31 is formed. As the interlayer insulating film 31, an insulating film containing silicon is formed in thickness from 100 to 200 nm by a plasma CVD method or a sputtering method. In this embodiment, a silicon oxynitride film is formed in 150 nm thick by a plasma CVD method. The interlayer insulating film 31 is not limited to the silicon oxynitride film and may have a single-layer structure or multilayer structure including another insulating film containing silicon. After that, a heat treatment, irradiation with high-intensity light, or irradiation with a laser beam is conducted in order to activate the impurity element. At the same time as the activation, it is possible to recover plasma damage to the gate insulating film or plasma damage to an interface between the gate insulating film and the semiconductor layer. In particular, it is very effective to activate the impurity element by irradiating with the second harmonic of a YAG laser from a top side or a rear side of the substrate in an atmosphere at a room temperature to 300° C. A YAG laser is a preferable activation means because the maintenance is not necessary so often. In the case of employing the laser annealing method, the method shown in Embodiment Mode of the present invention is preferably employed.

Figure 5E:
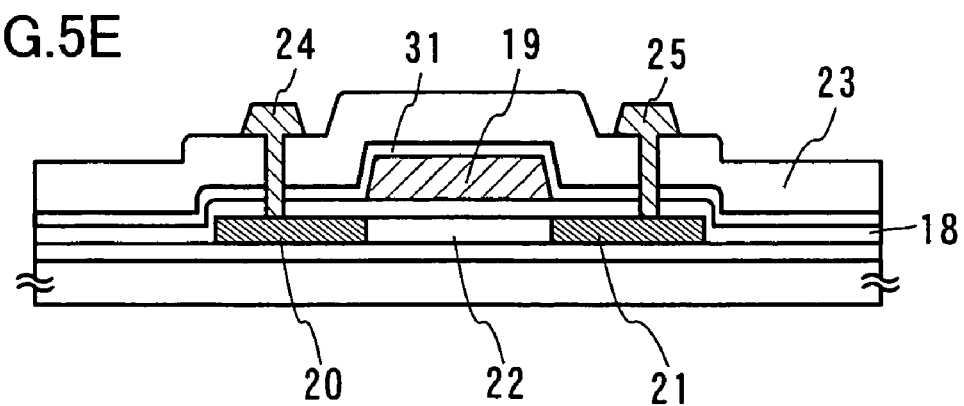

As the subsequent steps, an interlayer insulating film 23 is formed; hydrogenation is conducted; a contact hole reaching a source region and a drain region is formed; a conductive film is formed; and selective etching is conducted to form a source electrode 24 and a drain electrode 25. Thus, a TFT (n-channel TFT) is completed (FIG. 5E). The source electrode 24 and the drain electrode 25 are formed with a single layer or multilayer including an element selected from Mo, Ta, W, Ti, Al, and Cu, or an alloy material or compound material containing the above element as its main component. For example, a three-layer structure including a Ti film, a pure-Al film, and another Ti film, or a three-layer structure including a Ti film, an Al alloy film containing Ni and C, and another Ti film is used. Moreover, in consideration of forming an interlayer insulating film and the like in later steps, the cross-sectional shape of the electrode is preferably tapered.

The present invention is not limited to the TFT structure shown in FIG. 5E. The TFT may have another structure in which an LDD (Lightly Doped Drain) region is provided between the channel formation region and the drain region (or source region) if necessary. In this structure, a region in which an impurity element is added at low concentration is provided between the channel formation region and a source region or a drain region which is formed by adding the impurity element at high concentration, and this region is referred to as the LDD region. Moreover, another structure can also be employed in which the LDD region is disposed to overlap the gate electrode through the gate insulating film.

Although the n-channel TFT is described here, a p-channel TFT can also be formed by using a p-type impurity element instead of the n-type impurity element.

Here, although the top-gate TFT is described as an example, the present invention can be applied regardless of the TFT structure. For example, the present invention can be applied to a bottom-gate (inverted staggered) TFT or a staggered TFT.

By employing the laser annealing method of the present invention, it is possible to conduct a process without giving much thermal damage to the substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method of the present invention is superior industrially. By employing the laser annealing method of the present invention, the laser beam can be shaped into a linear form so that the point of focus of the opposite ends in the line direction does not displace. Therefore, homogeneous annealing can be conducted to the substrate.

Embodiment 2

Embodiment 2 will describe a method for manufacturing a light-emitting device (FIGS. 6A and 6B) having an EL element, which is also referred to as an organic EL display or an organic light-emitting diode.

An EL element having a layer containing an organic compound as a light-emitting layer has a structure in which the layer containing an organic compound (hereinafter referred to as an EL layer) is sandwiched between an anode and a cathode. By applying an electric field to the anode and the cathode, luminescence (Electro Luminescence) generates from the EL layer. Light emitted from the EL element includes light emitted when returning from a singlet-excited state to a ground state (fluorescence) and light emitted when returning from a triplet-excited state to the ground state (phosphorescence).

First, a base insulating film 811 is formed over a substrate 810. In the case of taking out emission light by setting the substrate 810 side as a display plane, a glass substrate or quartz substrate having a light-transmitting property is preferably used as the substrate 810. Moreover, a light-transmitting plastic substrate which can resist process temperature may be used. On the other hand, in the case of taking out the emission light by setting a side opposite to the substrate 810 side as the display plane, a silicon, metal, or stainless steel substrate with an insulating film formed thereover may be used besides the above mentioned substrate. Here, a glass substrate is used as the substrate 810. The refractive index of the glass substrate is approximately 1.55.

A base insulating film including an insulating film such as a silicon oxide film, a silicon nitride film, or a silicon oxynitride film is formed as the base insulating film 811. Here, an example of forming the base film having a two-layer structure is shown; however, a single-layer structure or multilayer structure having more than two layers including the insulating film may also be used. It is to be noted that the base insulating film is not necessarily formed.

Subsequently, a semiconductor layer is formed over the base insulating film. The semiconductor layer is formed with a semiconductor film having an amorphous structure by a known method (such as a sputtering method, an LPCVD method, or a plasma CVD method). Subsequently, a crystalline semiconductor film is obtained by a crystallization process. This crystallization process is conducted by using the laser crystallization method shown in Embodiment Mode of the present invention. The laser crystallization may be conducted alone or may be conducted in combination with another known crystallization process (such as RTA, a thermal crystallization method using a furnace anneal, or a thermal crystallization method using a catalyst like nickel). The material of the crystalline semiconductor film is not limited; however, silicon or silicon germanium alloy (SiGe) is preferably used. As a laser oscillator emitting a laser beam, a laser oscillator being able to emit ultraviolet light, visible light, or infrared light can be used. Typically, an excimer laser having a wavelength of 400 nm or shorter, or a second or third harmonic of a YAG laser is used. For example, a pulsed laser beam having a repetition rate of approximately 10 Hz to 100 MHz is used.

A continuous wave laser may be used in the laser irradiation at the crystallization process of the semiconductor film having the amorphous structure or in the laser irradiation after the crystallization. In order to obtain a large grain crystal after the crystallization of the amorphous semiconductor film, it is preferable to use a continuous wave solid-state laser and apply second to fourth harmonics of a fundamental wave. Typically, a second harmonic (532 nm) or a third harmonic (355 nm) of a Nd:YVO$_4$ laser (fundamental wave 1,064 nm) may be used.

Next, an extremely thin oxide film with a thickness of approximately 2 nm is formed on the surface by ozone water. Then, a small amount of impurity elements (such as boron or phosphorus) is added to control a threshold of a TFT. In this embodiment, an ion doping method is employed in which diborane (B$_2$H$_6$) is excited in plasma without mass-separating diborane under a condition where the acceleration voltage is set 15 kV, the gas contains diborane diluted with hydrogen to be 1 vol %, the gas flow rate is 30 sccm, and the dose is $2 \times 10^{12}/cm^2$, so that boron is added into the amorphous silicon film.

Next, the extremely thin oxide film on the surface is removed, and a thin oxide film is formed again. Then, a mask made of resist is formed using a first photomask, and a semiconductor layer isolated in a desired island shape is formed by conducting an etching process. At this stage, the thickness of the semiconductor layer is set so as to range from 25 to 80 nm (preferably 30 to 70 nm).

Next, the surface of the silicon film is washed at the same time as removing the oxide film with etchant including fluorinated acid. Then, an insulating film containing silicon as its main component is formed as a gate insulating film 812. Here, a silicon oxynitride film (composition ratio Si:O:N:H=32:59:7:2) is formed in 115 nm thick by a plasma CVD method.

Subsequently, a first conductive film having a thickness from 20 to 100 nm and a second conductive film having a thickness from 100 to 400 nm are stacked over the gate insulating film 812. In this embodiment, a tantalum nitride film of 50 nm thick and a tungsten film of 370 nm thick are stacked in order over the gate insulating film. As conductive materials for forming the first and second conductive films, an element selected from Ta, W, Ti, Mo, Al, and Cu or an alloy material or compound material containing the above element as its main component is used.

Next, a resist mask is formed using a second photomask, and etching is conducted by a dry etching method or a wet etching method. By this etching step, the conductive films are etched, thereby obtaining conductive layers 814*a*, 814*b*, 815*a*, and 815*b*. In this embodiment, an ICP (Inductively Coupled Plasma) etching method is used and the films are etched once or multiple times into a desired tapered shape by appropriately adjusting the etching condition (such as the electric power applied to a coil-shaped electrode, the electric power applied to an electrode on the substrate side, and the electrode temperature on the substrate side). As an etching gas, gas containing chlorine typified by Cl$_2$, BCl$_3$, SiCl$_4$, or CCl$_4$; gas containing fluorine such as CF$_4$, SF$_6$, or NF$_3$; or O$_2$ can be appropriately used. An angle of the tapered portion of the conductive layer 814*a* ranges from 15 to 45°, and that of the conductive layer 814*b* ranges from 60 to 89°.

The conductive layers 814*a* and 814*b* become a gate electrode of a TFT, while the conductive layers 815*a* and 815*b* become a terminal electrode.

Next, after removing the resist mask, a resist mask is newly formed using a third photomask. Then, a first doping step is conducted to dope the semiconductor with an impurity element imparting n-type conductivity (typically phosphorus or arsenic) at low concentration. The resist mask covers the region to become a p-channel TFT and a vicinity of the conductive layers. The first doping step is conducted through the insulating film, thereby forming a low-concentration impurity region. One light-emitting element is driven by using a plurality of TFTs; however, the doping step is not particularly necessary in the case of driving the light-emitting element only by using a p-channel TFT.

Next, after removing the resist mask, a resist mask is newly formed using a fourth photomask. Then, a second doping step is conducted to dope the semiconductor with an impurity element imparting p-type conductivity (typically boron) at high concentration. The second doping step is conducted through the gate insulating film 812, so that p-type high-concentration impurity regions 817 and 818 are formed and a channel formation region 819 is defined.

Next, a resist mask is newly formed using a fifth photomask. In order to form an n-channel TFT not shown in the figure, a third doping step is conducted to dope the semiconductor with an impurity element imparting n-type conductivity (typically phosphorus or arsenic) at high concentration. The condition of an ion doping method in the third doping step is that the dose is in the range of $1 \times 10^{13}$ to $5 \times 10^{15}/cm^2$ and the acceleration voltage is in the range of 60 to 100 keV. The resist mask covers the region to become a p-channel TFT and a vicinity of the conductive layers. The third doping step is conducted through the gate insulating film 812 to form an n-type high-concentration impurity region.

After that, the resist mask is removed and an insulating film 813 containing hydrogen is formed. Then, activation of the impurity element added in the semiconductor layer and hydrogenation are conducted. The insulating film 813 containing hydrogen is formed with a silicon nitride oxide film (SiN$_x$O$_y$: x>y>0) obtained by a PCVD method. The activation of the impurity element and the hydrogenation are conducted by a heat treatment, high-intensity light irradiation, or laser beam irradiation. By this process, at the same time, it is possible to recover plasma damage to the gate insulating film and plasma damage to an interface between the gate insulating film and the semiconductor layer. In particular, it is very effective to activate the impurity element by irradiating with the second harmonic of a YAG laser from a top side or a rear side of the substrate in an atmosphere at a room temperature to 300° C. A YAG laser is a preferable activation means because the maintenance is not necessary so often. In the case of employing the laser annealing method, the method shown in Embodiment Mode of the present invention is preferably employed. The insulating film 813 containing hydrogen is a first layer of the interlayer insulating film, and contains silicon oxide.

Next, a high heat resistant flattening film 816 is formed as a second layer of the interlayer insulating film. As the high heat resistant flattening film 816, an insulating film whose skeletal structure includes a bond of silicon (Si) and oxygen (O) obtained by a coating method is used. In this embodiment, a coating apparatus of a spin type in which a substrate is housed in parallel in a coating cup and which is equipped with a mechanism for rotating the whole including the coating cup and a mechanism for controlling the pressure of an atmosphere inside the coating cup is used. By using the coating apparatus, a coating material solution in which siloxane polymer is dissolved in a solvent (propylene glycol monometyl ether (molecular formula: $CH_3OCH_2CH(OH)CH_3$)) is dropped from a nozzle while gradually spinning the substrate (rotation number 0 rpm→1,000 rpm), so that the coating material solution is spread uniformly by centrifugal force. Then, an edge removing process is conducted by an edge remover equipped in the coating apparatus. Subsequently, prebake is conducted at 110° C. for 170 seconds. Next, the substrate is taken out from the coating apparatus of a spin type and cooled. After that, baking is conducted at 270° C. for one hour. Thus, the high heat resistant flattening film 816 is formed in 0.8 μm thick.

Depending on the structure of siloxane, siloxane can be classified into, for example, silica glass, alkylsiloxane polymer, alkylsilsesquioxane polymer, silsesquioxane hydride polymer, alkylsilsesquioxane hydride polymer, and the like. As an example of siloxane polymer, PSB-K1 and PSB-K31, which are a coating insulating film material manufactured by Toray Industries, Inc., and ZRS-5PH, which is a coating insulating film material manufactured by CATALYSTS&CHEMICALS IND. CO., LTD., are given.

Next, in order to dewater the high heat resistant flattening film 816, a heat treatment is conducted at 250 to 410° C. for one hour. This heat treatment may serve as both the activation of the impurity element added in the semiconductor layer and the hydrogenation. Further, a silicon nitride oxide film ($SiN_xO_y$(x>y>0): film thickness of 100 to 200 nm) obtained by a PCVD method may be formed as a third interlayer insulating film over the high heat resistant flattening film 816. In the case of forming the third interlayer insulating film, the third layer is preferably removed selectively by using a wiring 822 or a first electrode to be formed later as a mask.

Subsequently, a contact hole is formed in the high heat resistant flattening film 816 using a sixth mask. At the same time, the high heat resistant flattening film 816 in the periphery is removed. Here, etching (wet etching or dry etching) is conducted so that the high heat resistant flattening film 816 and the insulating film 813 have a selective ratio. The etching gas to be used is not limited; however, $CF_4$, $O_2$, He, and Ar are appropriate here.

Then, etching is conducted by using the sixth mask, so that the exposed gate insulating film 812 and insulating film 813 are selectively removed. The etching process is conducted to the gate insulating film 812 and the insulating film 813 by using $CHF_3$ and Ar as the etching gas. In order to etch so that residue is not left on the semiconductor layer, the etching time is preferably increased by approximately 10 to 20%.

Next, the sixth mask is removed, and a conductive film (a conductive film formed by stacking Ti, Al, and Ti in order, or a conductive film formed by stacking Mo, Al, and Mo in order) is formed. Then, etching is conducted by using a seventh mask, thereby forming the wiring 822.

Next, first electrodes 823R and 823G, that are, anodes (or cathodes) of an organic light-emitting element are formed. As a material of the first electrodes 823R and 823G, an element selected from Ti, TiN, $TiSi_xN_y$, Ni, W, $WSi_x$, $WN_x$, $WSi_xN_y$, NbN, Cr, Pt, Zn, Sn, In, and Mo, or an alloy or compound material containing such an element as its main component, or a film or multilayer film including such an alloy or compound material as its main component may be used with a total thickness from 100 to 800 nm.

In the case of taking out emission light by setting the substrate 810 side as a display plane, the first electrode is formed with ITSO (ITO (indium tin oxide) containing silicon oxide). Since ITSO is not crystallized even by a heat treatment, ITSO has high flatness and a process for removing a convex portion by washing or polishing is not particularly necessary. Therefore, ITSO is desirable as the material for the first electrode. Besides ITSO, a transparent conductive film such as a light-transmitting oxide conductive film which contains silicon oxide and in which zinc oxide (ZnO) is mixed in indium oxide by 2 to 20 at % may be used. Moreover, a transparent conductive film of ZnO containing Ga (also referred to as GZO) may be used.

Next, an insulator 829 (referred to as a partition wall, a barrier wall, or the like) is formed covering the first electrodes 823R and 823G using a ninth mask. As the insulator 829, an organic resin film obtained by a coating method, or an SOG (Spin On Glass) film (such as a $SiO_x$ film containing an alkyl group) is formed with a thickness of 0.8 to 1 μm.

Next, a hole-injecting layer 824H, light-emitting layers 824R and 824G, and an electron-transporting layer 824E, which are layers containing an organic compound, are formed by an evaporation method or a coating method. In order to increase the reliability, it is preferable to degas by conducting vacuum heating before forming the hole-injecting layer 824H. For example, before evaporating an organic compound material, a heat treatment at 200 to 400° C. is desirably conducted in a low-pressure atmosphere or an inert atmosphere in order to remove gas contained in the substrate. In this embodiment, since the interlayer insulating film is formed with a $SiO_x$ film having high heat resistance, the film can resist a heat treatment at high temperature.

In the case of forming a layer containing an organic compound by a coating method using spin coating, it is preferable to bake by vacuum heating after applying the organic compound. For example, after applying water solutions of poly (ethylene dioxythiophene), which is also referred to as PEDOT, and poly(styrene sulfone acid), which is also referred to as PSS, both serving as the hole-injecting layer 824H on the whole surface, baking is conducted.

The hole-injecting layer may be formed by an evaporation method. For example, an oxide such as molybdenum oxide ($MoO_x$: x=2 to 3) and α-NPD, or such an oxide and rubrene can be co-evaporated to form the hole-injecting layer, whereby the hole-injecting property increases.

Next, the light-emitting layers 824R and 824G and the electron-transporting layer 824E, which are the layers containing an organic compound, are formed by an evaporation method in a film-forming chamber which is evacuated so as to have a degree of vacuum at 0.665 Pa or less, preferably in the range of $0.133 \times 10^{-1}$ to $10^{-3}$ Torr. At the evaporation, the organic compound is vaporized in advance by resistance heating, and the vaporized organic compound spatters toward the substrate by opening the shutter. The vaporized organic compound spatters upward and goes through an opening portion provided in a metal mask, and then is deposited onto the substrate.

In order to achieve a full color, the mask is aligned for each of the emission colors (R, G, and B). It is to be noted that a full color display can also be achieved by forming an electroluminescent layer showing white light emission to separately provide a color filter, or a color filter and a color conversion layer, or the like.

For example, $Alq_3$ doped with DCM is formed in 40 [nm] thick as the light-emitting layer 824R. Moreover, $Alq_3$ doped with DMQD is formed in 40 [nm] thick as the light-emitting layer 824G Although not shown here, PPD (4,4'-bis(N-(9-phenanthryl)-N-phenylamino)biphenyl) doped with CBP (4,4'-bis(N-carbazolyl)-biphenyl) is formed in 30 nm thick as a blue light-emitting layer, and SAlq (bis(2-methyl-8-quinolinolato)(triphenylsilanolato)aluminum) is formed in 10 nm thick as a blocking layer.

Next, $Alq_3$ is formed in 40 [nm] thick as the electron-transporting layer 824E.

Next, a second electrode 825, that is, a cathode (or an anode) of the organic light-emitting element is formed. As the material of the second electrode 825, alloy such as MgAg, MgIn, AlLi, $CaF_2$, or $Ca_3N_2$ or a film formed by co-evaporating aluminum and an element belonging to the first or second group in the periodic table may be used. In the case where the second electrode 825 has light-transmitting property, a transparent conductive film may be formed.

Before forming the second electrode 825, a light-transmitting layer may be formed with $CaF_2$, $MgF_2$, or $BaF_2$ as a cathode buffer layer (in thickness from 1 to 5 nm).

Moreover, a protective layer (a thin film containing silicon nitride or carbon as its main component) for protecting the second electrode 825 may be formed.

Subsequently, the light-emitting element is sealed by pasting a sealing substrate 333 with a sealing material 828. The sealing substrate 833 and the substrate 810 are pasted to each other so that the seal material 828 covers an end portion (tapered portion) of the high heat resistant flattening film 816. A region surrounded by the seal material 828 is filled with a transparent filling material 827. As the filling material 827, a material can be used without any particular limitation as long as the material has a light-transmitting property, and typically an ultraviolet curable epoxy resin or a thermosetting epoxy resin is preferably used. A dry agent may be included in the filling material 827. Here, a high heat resistant UV epoxy resin (2500 Clear: manufactured by Electrolight) with a refractive index of 1.50, a viscosity of 500 cps, a shore D hardness of 90, a tensile intensity of 3,000 psi, a Tg point of 150° C., a volume resistance of $1\times10^{15}$ Ω·cm, and a withstanding voltage of 450 V/mil. By filling a space between the pair of substrates with the filling material 827, the transmissivity of the whole can be increased.

Further, after patterning the sealing material 828 over the sealing substrate 833 under an inert gas atmosphere or low pressure by a droplet discharging method, the pair of substrates may be pasted to each other by dropping the filling material 827 within the seal pattern using an ink jet apparatus or a dispenser apparatus under low pressure so that an air bubble does not enter. At the same time as the pasting, the seal material 828 may be cured under low pressure by conducting ultraviolet irradiation or a heat treatment. In addition to the ultraviolet irradiation, a heat treatment may be conducted.

Dry inert gas may fill a region surrounded by the seal material 828. In the case of filling the region with gas, it is preferable that a part of the sealing substrate 833 be ground to form a concave portion, and then a dry agent be disposed in the concave portion.

Figure 6A:
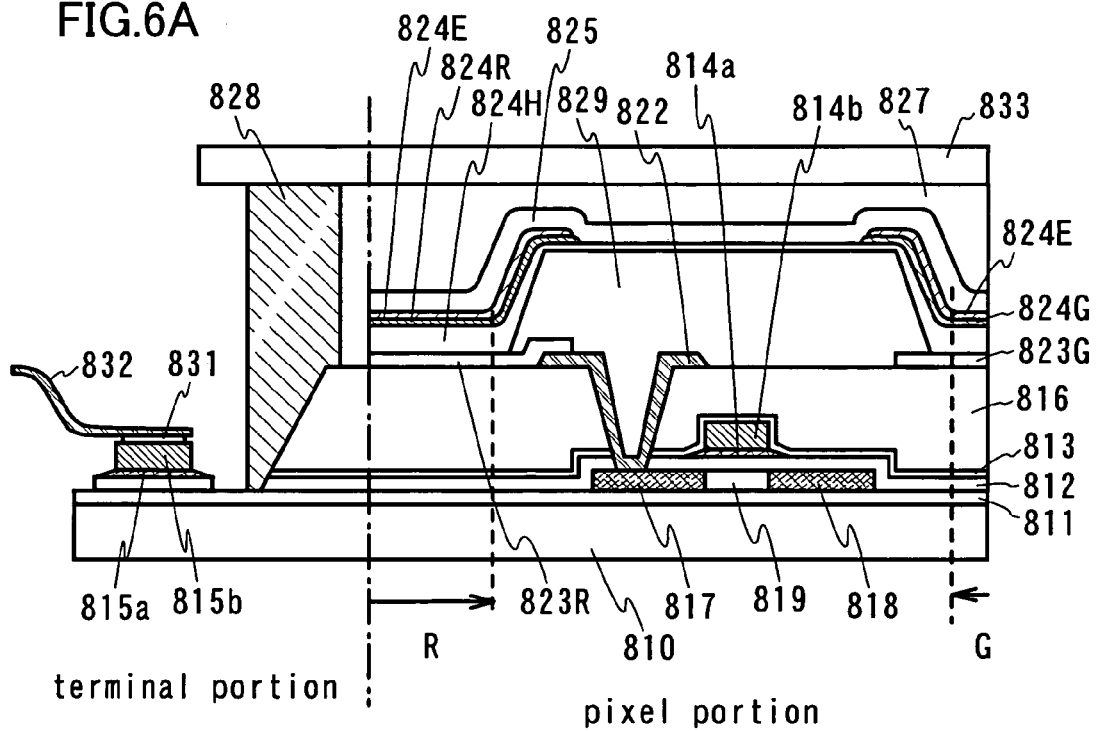
FIGS. 6A and 6B are cross-sectional views showing a structure of an active matrix EL display device.

Finally, an FPC (flexible print circuit) 832 is pasted to conductive layers 815a and 815b used as a terminal electrode by a known method with the use of an anisotropic conductive film 831. The conductive layers 815a and 815b are formed at the same time as the gate wiring (FIG. 6A). When the first electrodes 823R and 823G are formed, a transparent conductive film may be formed over the conductive layers 815a and 815b.

Figure 6B:
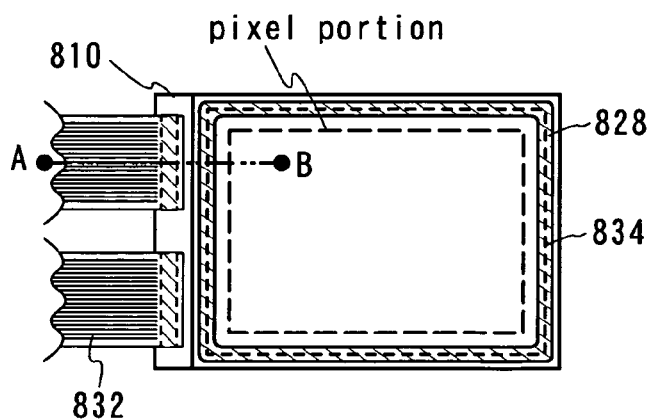

A top view is shown in FIG. 6B. As shown in FIG. 6B, an end portion 834 of the high heat resistant flattening film is covered with the sealing material 828. A cross-sectional view taken along a chain line A-B in FIG. 6B corresponds to FIG. 6A.

An active matrix light-emitting device manufactured thus has the high heat resistant flattening film 816 as an interlayer insulating film in a TFT, typically a material whose skeletal structure includes a bond of silicon (Si) and oxygen (O), and also includes silicon oxide in the first electrode. The reliability of the active matrix light-emitting device is increased by using a relatively stable material containing silicon oxide as the composition material of the light-emitting device.

When the first electrode is formed with a transparent material and the second electrode is formed with a metal material, a structure in which light is taken out through the substrate 810, that is, a bottom emission structure is obtained. Further, when the first electrode is formed with a metal material and the second electrode is formed with a transparent material, a structure in which light is taken out through the sealing substrate 833, that is, a top emission structure is obtained. If both of the first electrode and the second electrode are formed with a transparent material, light can be taken out from both of the substrate 810 and the sealing substrate 833. The present invention may employ either a top emission structure or a bottom emission structure appropriately.

In the light-emitting device according to the present invention, a driving method of screen displaying is not particularly limited. For example, a point sequential driving method, a line sequential driving method, a plane sequential driving method, or the like is preferably used. Typically, the line sequential driving method is used, and a time division gradation driving method or an area gradation driving method is preferably used as appropriate. Further, a video signal to be inputted into a source line of the light-emitting device may be either an analog signal or a digital signal. A driver circuit and the like may be designed appropriately in accordance with the video signal.

In a light-emitting device in which a video signal is digital, the video signal to be inputted into a pixel may use constant voltage (CV) or constant current (CC). When the video signal uses the constant voltage (CV), the voltage applied to the light-emitting element is constant (CVCV) or the current flowing through the light-emitting element is constant (CVCC). On the other hand, when the video signal uses the constant current (CC), the voltage applied to the light-emitting element is constant (CCCV) or the current flowing in the light-emitting element is constant (CCCC).

In the light-emitting display device according to the present invention, a protective circuit (such as a protective diode) may be provided to avoid electrostatic damage.

The present invention can be applied regardless of the TFT structure. For example, a top-gate TFT, a bottom-gate (inverted staggered) TFT, or a staggered TFT can be used. Not only a TFT of a single-gate structure but also a multi-gate TFT having a plurality of channel-forming regions, for example a double-gate TFT, may be used.

In order to enhance the contrast, a polarizing plate or a circular polarizing plate may be provided. For example, a polarizing plate or a circular polarizing plate can be provided on one surface or both surfaces of the display plane.

By employing the laser annealing method of the present invention, it is possible to conduct a process without giving much thermal damage to the substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method of the present invention is superior industrially. By employing the laser annealing method of the present invention, the laser beam can be shaped into a linear form so that the point of focus of the opposite ends in the line direction does not displace. Therefore, homogeneous annealing can be conducted to the substrate.

Embodiment 3

Figure 7:
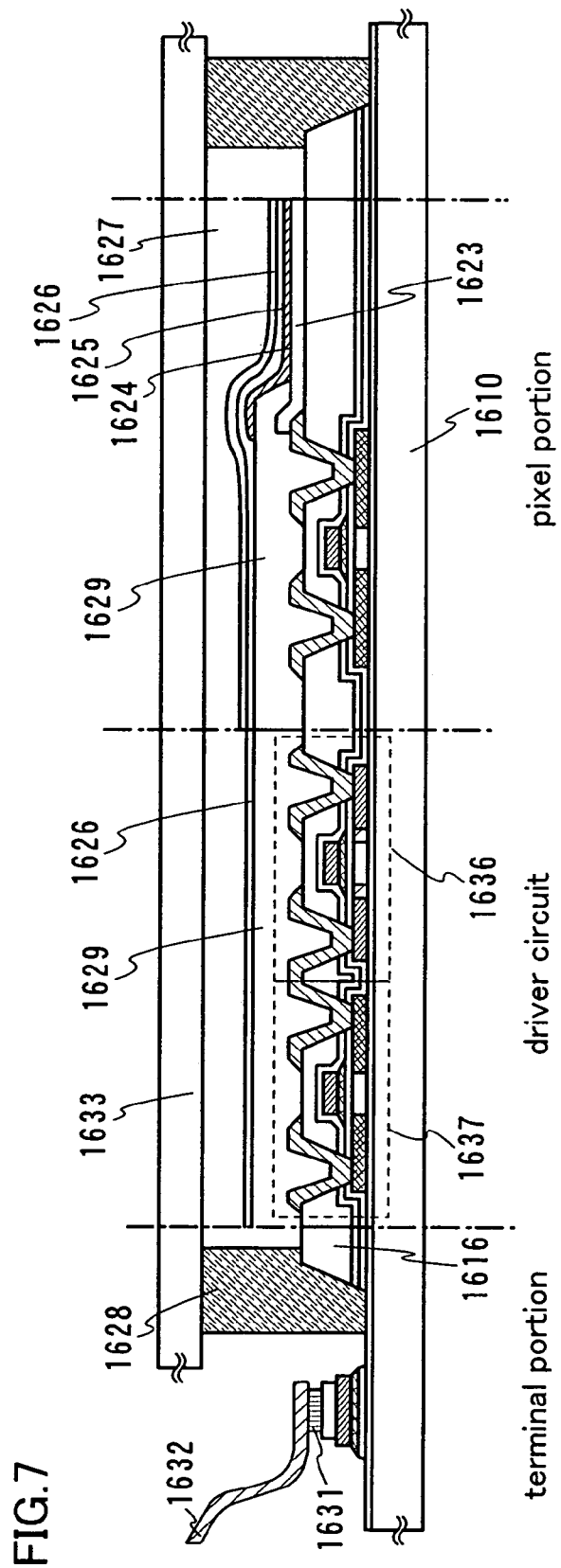
FIG. 7 is a cross-sectional view showing an EL display device.

Embodiment 2 has described only the pixel portion and the terminal portion. Meanwhile, Embodiment 3 will describe an example of forming a pixel portion, a driver circuit, and a terminal portion over one substrate with reference to FIG. 7.

After forming a base insulating film over a substrate 1610, each semiconductor layer is formed. Then, after forming a gate insulating film covering the semiconductor layer, each gate electrode and terminal electrode are formed. Subsequently, in order to form an n-channel TFT 1636, the semiconductor is doped with an impurity element imparting n-type conductivity (typically phosphorus or arsenic). In order to form a p-type TFT 1637, the semiconductor is doped with an impurity element imparting p-type conductivity (typically boron). Thus, a source region and a drain region, and if necessary, an LDD region are appropriately formed.

Next, a high heat resistant flattening film 1616 is formed as an interlayer insulating film. As the high heat resistant flattening film 1616, an insulating film whose skeletal structure includes a bond of silicon (Si) and oxygen (O) obtained by a coating method is used.

Next, a contact hole is formed in a SiNO film containing hydrogen and the high heat resistant flattening film by using a mask. At the same time, the high heat resistant flattening film in the periphery of the substrate is removed. The SiNO film and the high heat resistant flattening film may be tapered by conducting etching once or multiple times.

Next, etching is conducted by using the high heat resistant flattening film 1616 as a mask to selectively remove the exposed SiNO film containing hydrogen or the exposed gate insulating film.

Next, after forming a conductive film, etching is conducted using a mask, thereby forming a drain wiring and a source wiring.

Next, a first electrode 1623 formed with a transparent conductive film, that is, an anode (or cathode) of an organic light-emitting element is formed. At the same time, a transparent conductive film is also formed over the terminal electrode.

In the following steps, an insulator 1629, a layer 1624 containing an organic compound, a second electrode 1625 including a conductive film, and a transparent protective layer 1626 are formed and then the light-emitting element is sealed by pasting a sealing substrate 1633 with a sealing material 1628 in a similar way to Embodiment 2. A region surrounded by the sealing material 1628 is filled with a transparent filling material 1627. Finally, an FPC 1632 is pasted to the terminal electrode by a known method with the use of an anisotropic conductive film 1631. The terminal electrode is preferably formed by stacking a transparent conductive film over an electrode formed at the same time as the gate wiring.

By the above steps, the pixel portion, the driver circuit, and the terminal portion are formed over one substrate. As shown in this embodiment, since an n-channel TFT and a p-channel TFT can be manufactured over one substrate, the driver circuit and the protective circuit can be manufactured over one substrate, thereby decreasing the number of mount items of an IC (Integrated Circuit) chip for driving.

The light-emitting device of the present invention is not limited to the mode of manufacturing the n-channel TFT and the p-channel TFT over one substrate. The pixel portion and the driver circuit may be formed with only the n-channel TFT or only the p-channel TFT to decrease the number of steps.

Embodiment 4

Embodiment 4 will describe an example of manufacturing an active matrix liquid crystal display device (FIG. 8).

First, in accordance with Embodiment 1, a TFT 1105 having a semiconductor layer as its active layer and the like are formed over a substrate 1100, and a pixel portion is formed. The pixel portion includes pixel electrodes 1101 arranged in a matrix form, a switching element connected to the pixel electrode, here a top gate TFT 1105, and a holding capacitor. The holding capacitor uses an insulating film sandwiched between an electrode connected to the pixel electrode and the semiconductor layer as a dielectric. By the present invention, display unevenness due to variation in the amount of transmission light can be decreased. Moreover, according to the present invention, a flat semiconductor layer can be obtained. Therefore, an insulating film having uniform film thickness is obtained, and variation in the holding capacitor is decreased.

This embodiment shows an example of a double gate TFT having a plurality of channel formation regions in order to decrease off-current.

After forming the pixel portion, the step of forming an orientation film, a rubbing process, dispersing a spherical spacer, forming a pillar spacer, forming a color filter, and/or the like are/is conducted.

Next, a sealing material 1107 is patterned over an opposing substrate under an inert gas atmosphere or low pressure by a droplet discharging method. Here, the seal material 1107 is formed at a predetermined position (a closed pattern surrounding the pixel portion) by a dispenser apparatus or an ink jet apparatus. As a semi-transparent sealing material 1107, a material containing a filler (diameter of 6 to 24 μm) and having a viscosity of 40 to 400 Pa·s is used. It is to be noted that the seal material which does not dissolve in a liquid crystal to be in contact later is preferably selected. As the seal material, an acrylic photocurable resin or an acrylic thermosetting resin is preferably used. Since the seal material 1107 has an easy seal pattern, the seal material 1107 can also be formed by a printing method. Subsequently, the seal material 1107 is temporally cured.

Then, a liquid crystal is dropped in a region surrounded by the seal material 1107 by an ink jet apparatus or a dispenser apparatus. As the liquid crystal, a known liquid crystal material having viscosity that can be discharged by an ink jet apparatus or a dispenser apparatus may be used. Since the viscosity of the liquid crystal material can be set by adjusting the temperature, a droplet discharging method is appropriate. By a droplet discharging method, only a necessary amount of liquid crystals can be held in the region surrounded by the sealing material 1107.

After dropping the liquid crystal, the pair of substrates is pasted to each other under low pressure so that an air bubble does not enter. Here, at the same time as the pasting, ultraviolet irradiation or a heat treatment is conducted to cure the seal material 1107 under low pressure. In addition to the ultraviolet irradiation, a heat treatment may be conducted.

Next, the substrate is divided into a panel size appropriately, an FPC, an IC, an optical film, or the like is attached appropriately, thereby manufacturing a liquid crystal module.

Next, a backlight bulb 1104 and a mirror are provided to the obtained liquid crystal module, and the module is covered with a cover 1106. Thus, an active matrix liquid crystal display device (transmissive type) whose cross sectional shape is partially shown in FIG. 8 is completed. Alternatively, the backlight may be disposed outside the display region and a light guide plate may be used. The cover and the liquid crystal module are fixed by using an adhesive or an organic resin. Since the device is a transmissive type, a polarizing plate 1103 is pasted to both of the active matrix substrate and the opposing substrate. Further, another optical film (such as an anti-reflection film or a polarizing film) or a protective film (not shown) may be provided.

In FIG. 8, a reference numeral 1100 denotes a substrate; 1101, a pixel electrode; 1102, a pillar spacer; 1107, a sealing material; 1120, a colored layer serving as a color filter; 1125, a flattening film; 1121, an opposing electrode; 1122 and 1123, orientation films; 1124, a liquid crystal layer; and 1119, a protective film.

The liquid crystal display device of the present invention is not limited to the mode of manufacturing the n-channel TFT and the p-channel TFT over one substrate. The pixel portion and the driver circuit portion may be formed with only the n-channel TFT or only the p-channel TFT to decrease the number of steps.

By employing the laser annealing method of the present invention, it is possible to conduct a process without giving much thermal damage to the substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method of the present invention is superior industrially. By employing the laser annealing method of the present invention, the laser beam can be shaped into a linear form so that the point of focus of the opposite ends in the line direction does not displace. Therefore, homogeneous annealing can be conducted to the substrate. This provides an advantage that the operating characteristic and the reliability can be improved in the liquid crystal display device manufactured by this method.

Embodiment 5

Figure 9A:
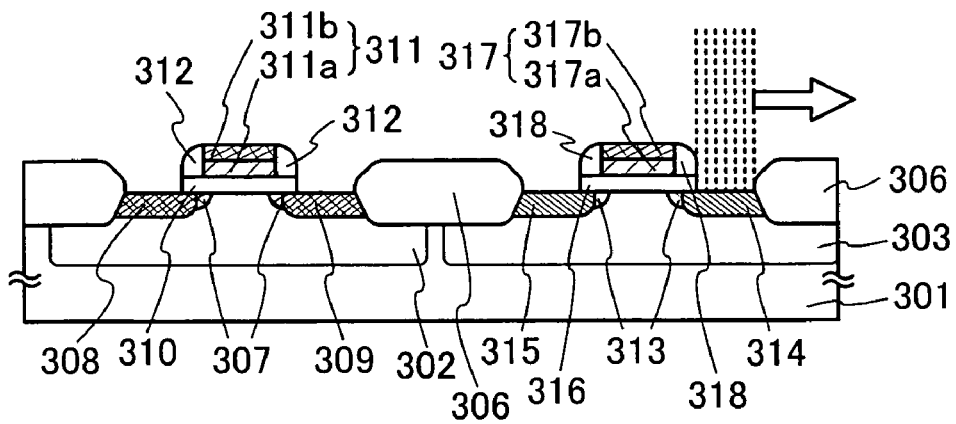
FIGS. 9A and 9B are cross-sectional views showing steps of manufacturing an FET.

A procedure of manufacturing an electric-field effect transistor (hereinafter referred to as a FET) using the present invention is simply shown with reference to FIGS. 9A and 9B.

First, a silicon substrate 301 including single-crystal silicon is prepared. Then, on a main plane of the silicon substrate (a plane where an element is to be formed or a plane where a circuit is to be formed), selectively, an n-type well 302 is formed in a first element formation region and a p-type well 303 is formed in a second element formation region.

Next, a field oxide film 306 to become an element separation region for partitioning the first element formation region and the second element formation region. The field oxide film 306 is a thick thermal oxide film which may be formed by a known LOCOS (local oxidation of silicon) method. The element separation method is not limited to the LOCOS method, and for example, the element separation region may have a trench structure by using a trench separation method or the LOCOS structure may be combined with the trench structure.

Next, a gate insulating film is formed by thermally oxidizing the main plane of the silicon substrate. The gate insulating film may be formed by a CVD method or may be formed with a silicon oxynitride film, a silicon oxide film, or a silicon nitride film, or a multilayer film of these. For example, a multilayer film including a silicon oxide film of 5 nm thick obtained by thermal oxidation and a silicon oxynitride film of 10 to 15 nm thick obtained by a CVD method is formed.

Subsequently, a multilayer film including poly-silicon layers 311a and 317a and silicide layers 311b and 317b is formed over the whole surface, and the multilayer is selectively etched, thereby forming gate electrodes 311 and 317 having a polycide structure over the gate insulating film. In order to make the poly-silicon layers 311a and 317a low resistant, phosphorus (P) may be added in advance at a concentration of approximately $10^{21}/cm^3$. Alternatively, an n-type impurity may be diffused at high concentration after forming the polysilicon layer. As the material for forming the silicide layers 311b and 317b, it is possible to use molybdenum silicide ($MoSi_x$), tungsten silicide ($WSi_x$), tantalum silicide ($TaSi_x$), titanium silicide ($TiSi_x$), or the like by a known method.

Next, ion implantation is conducted shallowly at low concentration to dope the silicon semiconductor substrate with an n-type or p-type impurity through the gate insulating film, so that a $p^-$ region 307 and an $n^-$ region 313 are formed. By forming these $p^-$ region 307 and $n^-$ region 313, the concentration of the impurity has gradient at an end portion of the gate electrode, whereby the reliability of an FET increases.

Since a CMOS is manufactured in this embodiment, the first element formation region where a p-channel FET is to be formed is covered with a resist material, and then arsenic (As) or phosphorus (P), which is an n-type impurity, is implanted into the silicon substrate. Further, the second element formation region where an n-channel FET is to be formed is covered with a resist material, and then boron (B), which is a p-type impurity, is implanted into the silicon substrate.

Next, in order to activate the implanted impurity ion and to recover a crystal defect in the silicon substrate caused by the ion implantation, a first activation process is conducted. In this embodiment, the laser annealing method shown in Embodiment Mode of the present invention is employed in the first activation process. At this time, the semiconductor substrate is heated instantaneously up to the temperature as high as a melting point of Si, so that a thin layer on the surface is locally heated for the activation. By this process, the implanted impurity can be activated sufficiently. Moreover, the travel distance of the impurity by this process is as short as approximately 1 nm or less, whereby the diffusion of the impurity can be suppressed as much as possible.

Next, sidewalls 312 and 318 are formed at side walls of the gate electrode. For example, an insulating material layer including silicon oxide may be deposited on the whole surface by a CVD method, and the insulating material layer may be etch-backed to form the sidewalls. At the etching-back, the gate insulating film may be selectively removed in a self-aligning manner. Moreover, the gate insulating film may be etched after the etching-back. In this way, gate insulating films 310 and 316 having a width corresponding to the total widths of the gate electrode and the sidewalls formed at the opposite sides of the side wall of the gate electrode are formed.

Subsequently, in order to form the source region and the drain region, the ion is implanted into the exposed silicon substrate. Since a CMOS is to be manufactured, the first element formation region where a p-channel FET is to be formed is covered with a resist material, and then arsenic (As) or phosphorus (P), which is an n-type impurity, is implanted into the silicon substrate, so that a source region 314 and a drain region 315 are formed. Further, the second element formation region where an n-channel FET is to be formed is covered with a resist material, and then boron (B), which is a p-type impurity, is implanted into the silicon substrate, so that a source region 308 and a drain region 309 are formed.

Subsequently, in order to activate the implanted impurity ion and to recover a crystal defect in the silicon substrate caused by the ion implantation, a second activation process is conducted. In this embodiment, the laser annealing method shown in Embodiment Mode of the present invention is also employed in the second activation process. A cross-sectional view at this stage corresponds to FIG. 9A.

Then, an interlayer insulating film, a plug electrode, a metal wiring, and the like are formed after the activation. A first interlayer insulating film 331 is formed with a silicon oxide film, a silicon oxynitride film, or the like in thickness from 100 to 2,000 nm by a plasma CVD method or a low-pressure CVD method. Moreover, a second interlayer insulating film 332 is formed over the first interlayer insulating film 331 with phosphosilicate glass (PSG), borosilicate glass (BSG), or phosphoborosilicate glass (PBSG). The second interlayer insulating film 332 is formed by a spin coating method or a normal-pressure CVD method to increase the flatness.

Source electrodes 333 and 335, and drain electrodes 334 and 336 are formed after forming contact holes that reach the source region and the drain region of the respective FETs in the first interlayer insulating film 331 and the second interlayer insulating film 332, and are preferably formed with aluminum (Al), which is often used as a low resistant material. Further, a multilayer structure of Al and titanium (Ti) may be employed.

Although not shown here, a contact hole that reaches the gate electrode is provided in the first interlayer insulating film 331 and the second interlayer insulating film 332, and an electrode to be electrically connected to a wiring provided over the first interlayer insulating film is formed.

Figure 9B:
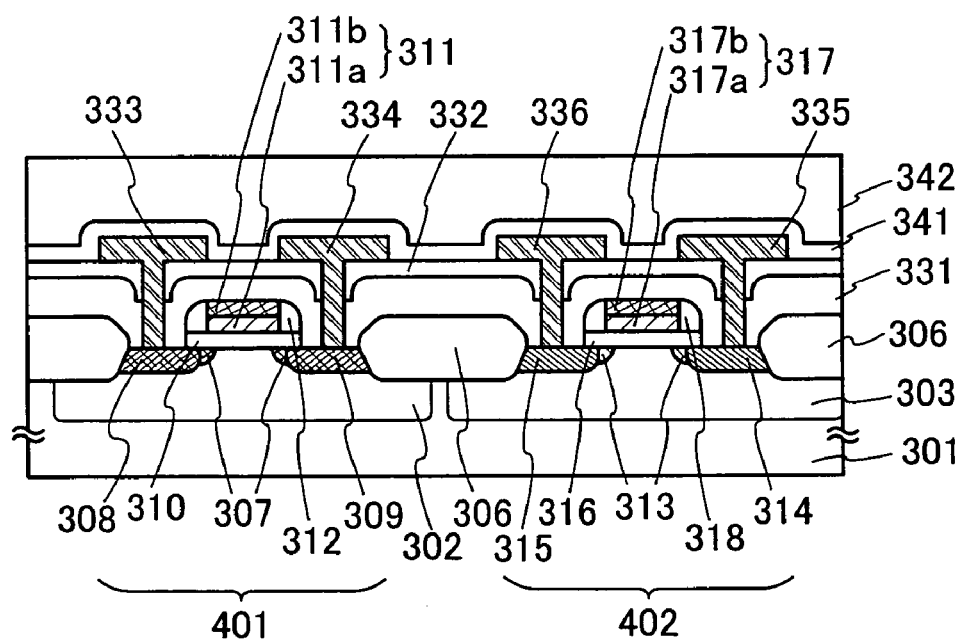

Finally, a passivation film 341 and a third interlayer insulating film 342 are formed to obtain a state of FIG. 9B. In FIG. 9B, a p-channel FET 401 is on the left side, while an n-channel FET 402 is on the right side.

The passivation film 341 is formed with a silicon nitride film, a silicon oxide film, or a silicon nitride oxide film by a plasma CVD method. Moreover, the third interlayer insulating film 342 is formed with an organic resin material in thickness from 1 to 2 μm. As the organic resin material, polyimide, polyamide, acrylic, benzocyclobutene (BCB), or the like can be used. By using the organic resin film, such advantages are obtained that the film can be formed easily, a parasitic capacity can be decreased because of its low dielectric constant, the film can be flattened easily, and so on. Other organic resin films than the above mentioned ones may also be used.

By employing the laser annealing method of the present invention, it is possible to conduct a process without giving much thermal damage to the substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method of the present invention is superior industrially. By employing the laser annealing method of the present invention, the laser beam can be shaped into a linear form so that the point of focus of the opposite ends in the line direction does not displace. Therefore, homogeneous annealing can be conducted to the substrate.

Embodiment 6

Various electronic appliances can be completed by mounting an integrated circuit in which TFTs manufactured by using a laser annealing method of the present invention are integrated. Moreover, when a TFT manufactured by a laser annealing method of the present invention is used as a switching element and a pixel electrode to be connected to the switching element is provided, an active matrix substrate can be manufactured. Further, when the active matrix substrate is used to form a display portion of an electronic appliance, various electronic appliances can be completed.

As such electronic appliances, a personal computer, a game machine, a mobile information terminal (such as a mobile computer, a mobile phone, a mobile game machine, or an electronic book), a camera such as a video camera or a digital camera, a projector, a navigation system, a sound reproducing device (such as a car audio or an audio component), an image reproducing device equipped with a recording medium (specifically, a digital versatile disc (DVD)), and the like are given.

A mobile phone as one electronic appliance of the present invention is described as an example with reference to FIG. 10. This embodiment will show an example in which a mobile phone 900 is completed with an active matrix liquid crystal display device or a light-emitting element having an EL element described in Embodiments 2 to 4.

A mobile phone shown in FIG. 10 has a main body (A) 901 equipped with operation switches 904, a microphone 905, and the like and also has a main body (B) 902 equipped with a display panel (A) 908, a display panel (A) 909, a speaker 906, and the like. The main body (A) 901 and the main body (B) 902 are connected to each other with a hinge 910 so as to open and close. The display panel (A) 908 and the display panel (B) 909 are housed in a case 903 of the main body (B) 902 together with a circuit substrate 907. Pixel portions of the display panel (A) 908 and the display panel (B) 909 are arranged so as to be observed from an opening window formed in the case 903.

In the display panel (A) 908 and the display panel (B) 909, their specifications such as the number of pixels can be set appropriately in accordance with the function of the mobile phone 900. For example, the display panel (A) 908 and the display panel (B) 909 can be combined by setting the display panel (A) 908 as a main screen and the display panel (B) 909 as a sub screen.

By employing the laser annealing method of the present invention, it is possible to conduct a process without giving much thermal damage to the substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method of the present invention is superior industrially. By employing the laser annealing method of the present invention, the laser beam can be shaped into a linear form so that the point of focus of the opposite ends in the line direction does not displace. Therefore, homogeneous annealing can be conducted to the substrate. This makes it possible to provide advantages that the electronic appliance equipped with the display panel (A) 908 can have high operating characteristic and high reliability.

By using such a display panel, the display panel (A) 908 can serve as a color display screen with high definition which displays a text or an image, while the display panel (B) 909 can serve as an information display green of a single color which displays textual information. In particular, when higher definition is achieved by having an active matrix type of the display panel (B) 909, various pieces of textual information can be displayed so that the density of displaying information per screen can be increased. For example, when the display panel (A) 908 is a QVGA (320 dots×240 dots) with a size of 2 to 2.5 inch, 64 tones, and 260,000 colors and the display panel (B) 909 is a high-definition panel with a single color, 2 to 8 tones, and 180 to 220 ppi, Chinese characters, Arabic letters, and the like can be displayed as well as Roman letters, hiragana, and katakana.

The mobile phone described in this embodiment can be modified into various forms in accordance with its function or an intended purpose. For example, an image pickup device may be incorporated in a portion of the hinge 910 and be treated as a camera-equipped mobile phone. Moreover, the above operation effect can be obtained even when the operation switches 904, the display panel (A) 908, and the display panel (B) 909 are housed in one case. Furthermore, a similar effect can be obtained even by applying the structure of this embodiment to a mobile display terminal equipped with a plurality of display portions.

Embodiment 7

Various electronic appliances can be completed by using TFTs manufactured using a laser annealing method of the present invention. Specific examples of the electronic appliances are described with reference to FIGS. 11 to 13.

Figure 11:
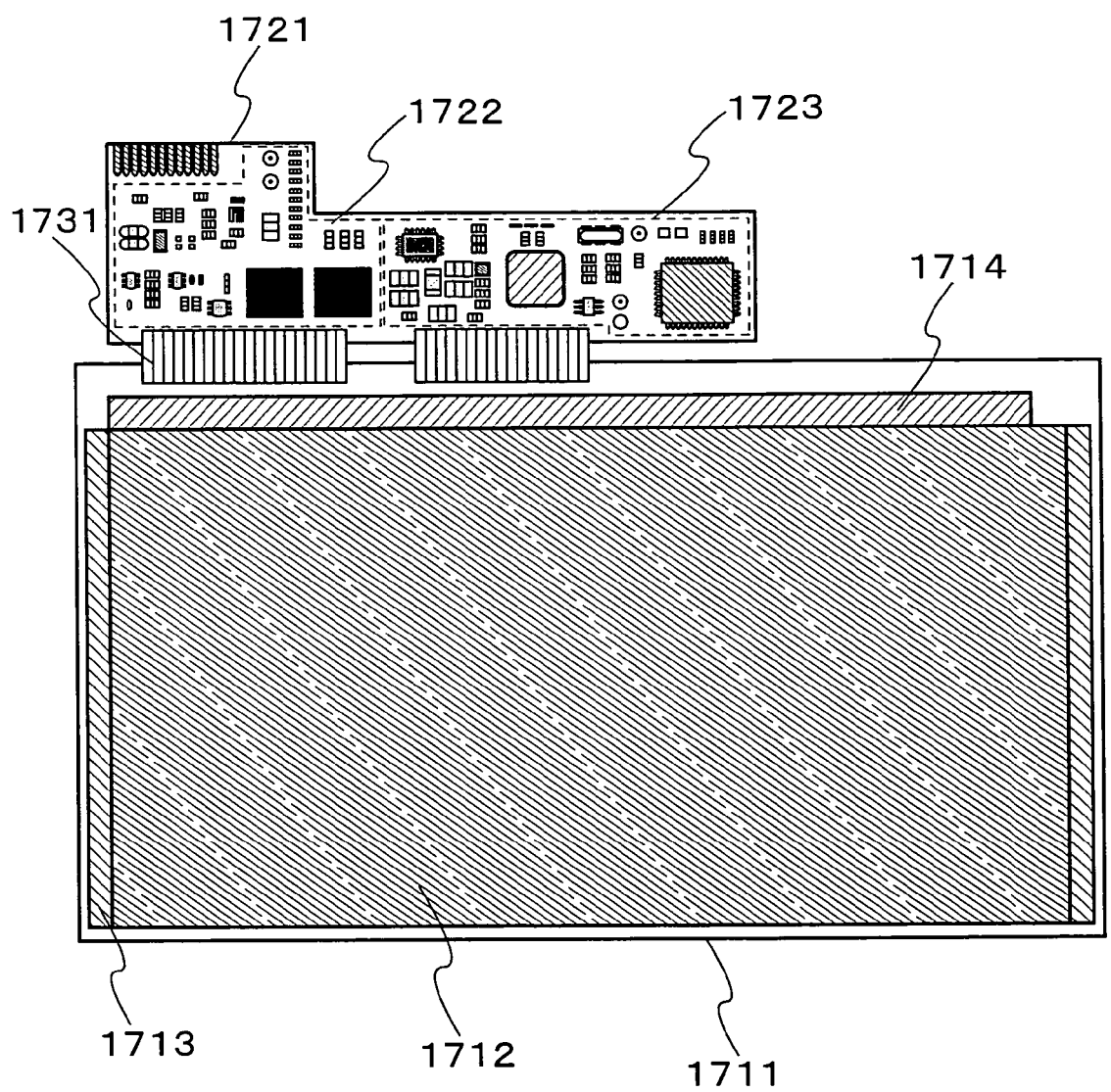
FIG. 11 shows an example of an electronic appliance.

FIG. 11 shows a liquid crystal module or an EL module in which a display panel 1711 and a circuit substrate 1721 are combined and connected with a connection wiring 1731. Over the circuit substrate 1721, for example, a control circuit 1722, a signal division circuit 1723, and the like are formed.

This display panel 1711 is equipped with a pixel portion 1712, a scanning line driver circuit 1713, and a signal line driver circuit 1714 for supplying a video signal to the selected pixel. This structure is similar to that shown in Embodiment 2, 3, or 4.

Figure 12:
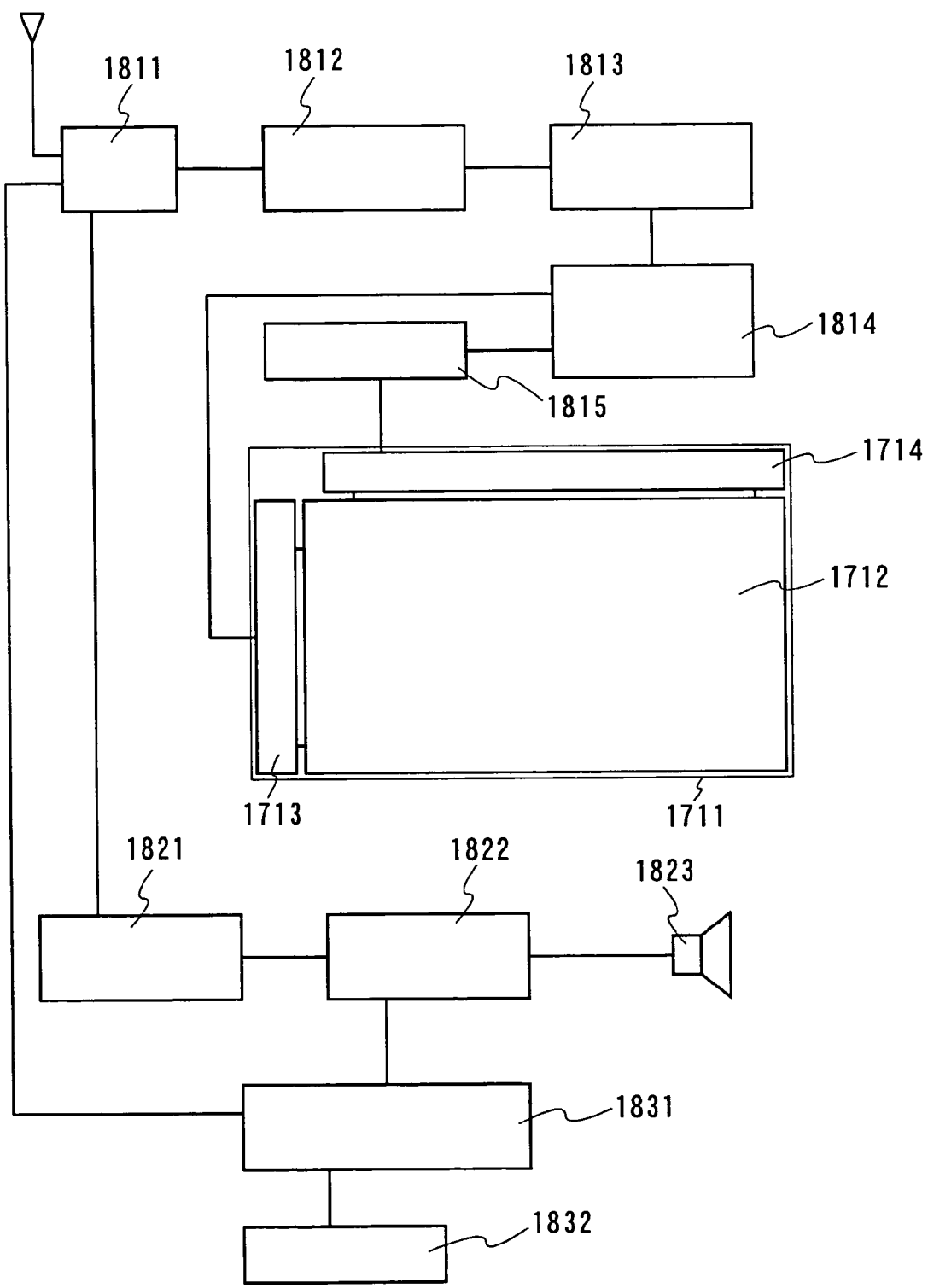
FIG. 12 shows an example of an electronic appliance.

A television receiving machine can be completed with this liquid crystal module or EL module. FIG. 12 is a block diagram showing a main structure of the television receiving machine. A tuner 1811 receives a video signal and an audio signal. The video signal is processed by a video signal amplifying circuit 1812; a video signal processing circuit 1813 for converting a signal outputted from the video signal amplifying circuit 1812 into a color signal corresponding to each color of red, green, and blue; and a control circuit 1814 for converting the video signal in accordance with an input specification of a driver IC. The control circuit 1814 outputs signals to the scanning line side and the signal line side, respectively. In the case of digital driving, a signal division circuit 1815 may be provided on the signal line side, and the inputted digital signal may be divided into m number and supplied. Similarly to FIG. 11, the display panel 1711 is equipped with the pixel portion 1712, the scanning line driver circuit 1713, and the signal line driver circuit 1714 for supplying a video signal to the selected pixel.

Among the signals received by the tuner 1811, the audio signal is sent to an audio signal amplifying circuit 1821 and its output is supplied to a speaker 1823 through an audio signal processing circuit 1822. A control circuit 1831 receives control information such as a receiving station (receiving frequency) or sound volume from an input portion 1832 and sends a signal to the tuner 1811 or the audio signal processing circuit 1822.

Figure 13:
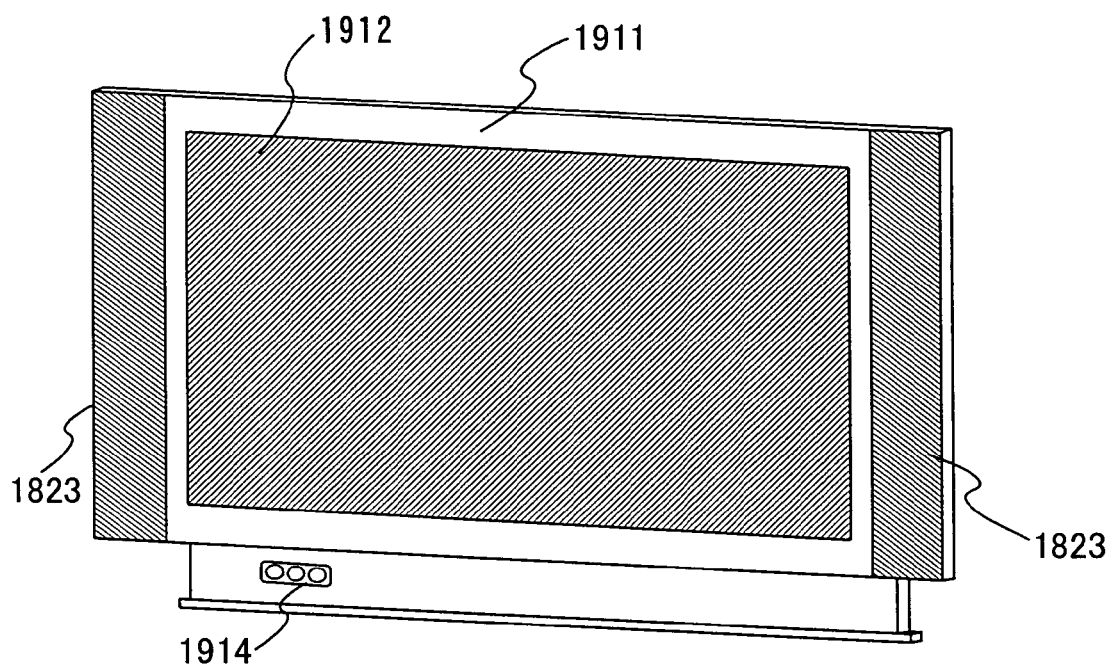
FIG. 13 shows an example of an electronic appliance.
Figure 14:
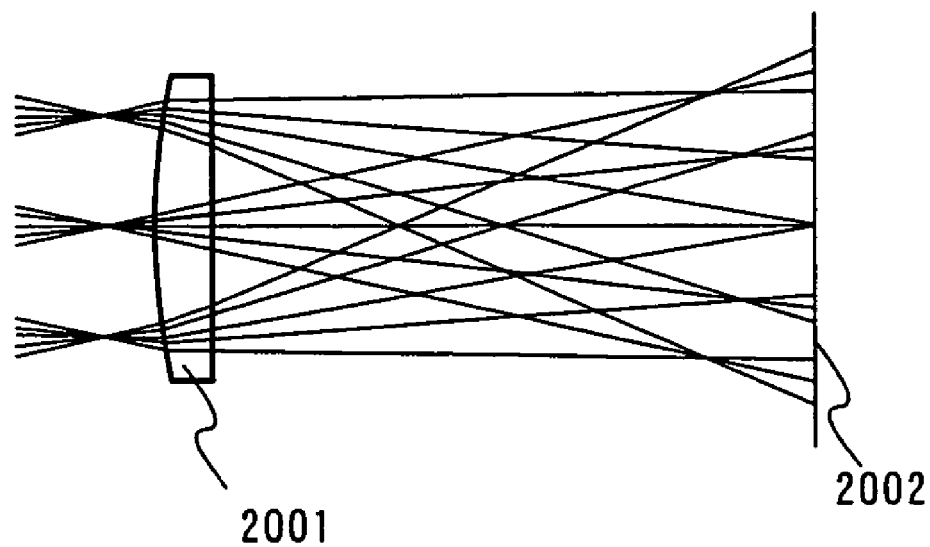
FIG. 14 shows an example in which a curved field is formed.

As shown in FIG. 13, a television receiving machine can be completed by incorporating a liquid crystal module or an EL module into a case 1911. By the liquid crystal module or the EL module, a display screen 1912 is formed. Moreover, a speaker 1823, operation switches 1914, and the like are provided appropriately.

This television receiving machine includes the display panel 1711. By employing the laser annealing method of the present invention, it is possible to conduct a process without giving much thermal damage to the substrate, because the substrate is selectively heated and the process time is drastically shortened as compared with another annealing method using radiant heat or conductive heat. Then, the laser beam is shaped into a linear form on an irradiation surface by an optical system, and the irradiation position of the laser beam is moved relative to the irradiation surface. Thus, a large area of the semiconductor can be annealed at one time. Therefore, for its high productivity, the laser annealing method of the present invention is superior industrially. By employing the laser annealing method of the present invention, the laser beam can be shaped into a linear form so that the point of focus of the opposite ends in the line direction does not displace. Therefore, homogeneous annealing can be conducted to the substrate. This makes it possible to provide advantages that the electronic appliance equipped with the display panel 1711 can have a high operating characteristic and high reliability.

The present invention is not limited to the television receiving machine, and can be applied to various purposes such as a monitor for a computer, and particularly applied a display medium of a large size, such as an information display board at a railway station or an airport, or an advertisement display board at a street.

What is claimed is:

1. A laser irradiation apparatus comprising:
a laser oscillator; and
an optical system for shaping a laser beam emitted from the laser oscillator into a linear beam spot having a long-side direction and a short-side direction;
wherein the optical system includes:
a first cylindrical lens array for dividing the laser beam emitted from the laser oscillator in the long-side direction;
a first cylindrical lens for superposing the laser beams divided by the first cylindrical lens array;

a second cylindrical lens array for dividing the laser beam emitted from the laser oscillator in the short-side direction;

a second cylindrical lens for superposing the laser beams divided by the second cylindrical lens array, thereby forming a homogeneous plane; and a third cylindrical lens for projecting the homogeneous plane to an irradiation surface;

wherein the first cylindrical lens is disposed between the second cylindrical lens and the third cylindrical lens, wherein the first cylindrical lens array comprises a cylindrical lens which is asymmetric along a generatrix thereof, and wherein a displacement of the homogeneous plane toward the irradiation surface depends on a thickness of the first cylindrical lens in the long-side direction.

2. The laser irradiation apparatus according to claim 1, wherein all the cylindrical lenses forming the first cylindrical lens array are designed so that a distance from the homogeneous plane to the third cylindrical lens becomes constant not depending on a field angle of the laser beam.

3. The laser irradiation apparatus according to claim 1, wherein a cylindrical lens which is symmetric along a generatrix thereof and a cylindrical lens which is asymmetric along the generatrix thereof are used as cylindrical lenses forming the first cylindrical lens array, and wherein all the cylindrical lenses forming the first cylindrical lens array are designed so that a distance from the homogeneous plane to the third cylindrical lens becomes constant not depending on a field angle of the laser beam.

4. The laser irradiation apparatus according to claim 1, wherein the laser oscillator is an excimer laser, a YAG laser, a glass laser, a $YVO_4$ laser, a YLF laser, or an Ar laser.

5. A laser irradiation method comprising:

dividing a laser beam emitted from a laser oscillator in a long-side direction and a short-side direction by passing through a first cylindrical lens array and a second cylindrical lens array;

superposing the laser beams divided in the short-side direction by passing through a second cylindrical lens;

superposing the laser beams divided in the long-side direction by passing through a first cylindrical lens as well as refracting the laser beam which has been superposed in the short-side direction so that a position of a homogeneous plane in the short-side direction is formed closer to an irradiation surface; and projecting the homogeneous plane to the irradiation surface by a third cylindrical lens and superposing the laser beams divided in the long-side direction on the irradiation surface, so that a linear beam spot having the long-side direction and the short-side direction is delivered to the irradiation surface;

wherein the first cylindrical lens array comprises a cylindrical lens which is asymmetric along a generatrix thereof and wherein a displacement of the homogeneous plane toward the irradiation surface depends on a thickness of the first cylindrical lens in the long-side direction.

6. The laser irradiation method according to claim 5, wherein all the cylindrical lenses forming the first cylindrical lens array are designed so that a distance from the homogeneous plane to the third cylindrical lens becomes constant not depending on a field angle of the laser beam.

7. The laser irradiation method according to claim 5, wherein a cylindrical lens which is symmetric along a generatrix thereof and a cylindrical lens which is asymmetric along the generatrix thereof are used as cylindrical lenses forming the first cylindrical lens array, and wherein all the cylindrical lenses forming the first cylindrical lens array are designed so that a distance from the homogeneous plane to the third cylindrical lens becomes constant not depending on a field angle of the laser beam.

8. The laser irradiation method according to claim 5, wherein the laser oscillator is an excimer laser, a YAG laser, a glass laser, a $YVO_4$ laser, a YLF laser, or an Ar laser.

9. A method for manufacturing a semiconductor device according to claim 5, further comprising:

forming a semiconductor film over a substrate; and scanning the semiconductor film with the linear beam spot.

* * * * *